United States Patent
Jin et al.

(10) Patent No.: US 9,570,377 B2
(45) Date of Patent: Feb. 14, 2017

(54) SEMICONDUCTOR DEVICES HAVING THROUGH ELECTRODES CAPPED WITH SELF-ALIGNED PROTECTION LAYERS

(71) Applicants: Jeonggi Jin, Seoul (KR); Byung Lyul Park, Seoul (KR); Jisoon Park, Suwon-si (KR); Sukchul Bang, Yongin-si (KR); Deokyoung Jung, Seoul (KR)

(72) Inventors: Jeonggi Jin, Seoul (KR); Byung Lyul Park, Seoul (KR); Jisoon Park, Suwon-si (KR); Sukchul Bang, Yongin-si (KR); Deokyoung Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/677,649

(22) Filed: Apr. 2, 2015

(65) Prior Publication Data

US 2015/0287680 A1     Oct. 8, 2015

(30) Foreign Application Priority Data

Apr. 4, 2014   (KR) ................ 10-2014-0040773

(51) Int. Cl.
*H01L 23/48*      (2006.01)
*H01L 21/768*     (2006.01)
*H01L 23/532*     (2006.01)

(52) U.S. Cl.
CPC ....... *H01L 23/481* (2013.01); *H01L 21/76834* (2013.01); *H01L 21/76849* (2013.01); *H01L 21/76867* (2013.01); *H01L 21/76883* (2013.01); *H01L 21/76898* (2013.01); *H01L 23/5329* (2013.01); *H01L 23/53295* (2013.01); *H01L 21/76805* (2013.01); *H01L 23/53238* (2013.01); *H01L 2224/11* (2013.01); *H01L 2924/0002* (2013.01)

(58) Field of Classification Search
CPC ..................................................... H01L 23/481
USPC ......................................................... 257/751
See application file for complete search history.

(56) References Cited

U.S. PATENT DOCUMENTS

| 7,396,759 B1 | 7/2008 | van Schravendijk et al. |
| 8,013,443 B2 | 9/2011 | Tsai et al. |
| 8,013,446 B2 | 9/2011 | Yang et al. |

(Continued)

OTHER PUBLICATIONS

A. Maestre Caro et al., "Enabling Cu-Cu connection in (dual) damascene interconnects by selective deposition of two different SAM molecules" 2011 IEEE, pp. 1-3.

(Continued)

*Primary Examiner* — Anthony Ho
(74) *Attorney, Agent, or Firm* — Myers Bigel, P.A.

(57) ABSTRACT

Semiconductor devices having through electrodes capped with self-aligned protection layers. The semiconductor device comprises a semiconductor substrate including an integrated circuit formed therein, an interlayer dielectric layer on the semiconductor substrate to cover the integrated circuit, an intermetal dielectric layer having at least one metal line that is provided on the interlayer dielectric layer and is electrically connected to integrated circuit, and a through electrode that vertically penetrates the interlayer dielectric layer and the semiconductor substrate. The through electrode includes a top portion that is capped with a first protection layer capable of preventing a constituent of the through electrode from being diffused away from the through electrode.

18 Claims, 23 Drawing Sheets

(56) References Cited

U.S. PATENT DOCUMENTS

| | | | |
|---|---|---|---|
| 8,114,772 | B2 | 2/2012 | Lee et al. |
| 8,125,085 | B2 | 2/2012 | Maekawa et al. |
| 8,299,365 | B2 | 10/2012 | Nguyen et al. |
| 8,384,174 | B2 | 2/2013 | Chiu et al. |
| 8,390,120 | B2 | 3/2013 | Moon et al. |
| 8,404,587 | B2 | 3/2013 | Kirby et al. |
| 2013/0143400 | A1 | 6/2013 | Farooq et al. |

OTHER PUBLICATIONS

Kodera et al., "*Localized Oxidation of the Cu Surface After Chemical Mechanical Planarization Processing*" *Japanese Journal of Applied Physics*; vol. 44, No. 12, (2005) pp. 8396-8400.

SEMICONDUCTOR DEVICES HAVING THROUGH ELECTRODES CAPPED WITH SELF-ALIGNED PROTECTION LAYERS

CROSS-REFERENCE TO RELATED APPLICATIONS

This U.S. nonprovisional patent application claims priority under 35 U.S.C. §119 of Korean Patent Application 10-2014-0040773 filed on Apr. 4, 2014, the entire contents of which are hereby incorporated by reference.

BACKGROUND

The present inventive concept relates to semiconductor and, more particularly, to semiconductor devices having through electrodes capped with self-aligned protection layers.

Through electrodes have been developed to electrically connect a semiconductor device to different semiconductor device or an integrated circuit board. The though electrodes are used to accomplish a three-dimensional mounting and a faster transmittance speed compared to the conventional solder balls. New method and structure of the through electrode are required to improve electrical characteristics of the semiconductor device.

SUMMARY

Embodiments of the present inventive concept provide semiconductor devices and method for fabricating the same capable of eliminating or reducing electrical defectiveness of the through electrode.

Embodiments of the present inventive concepts provide semiconductor devices and method for fabricating the same in which a top portion of the through electrode is capped with a self-aligned protection layer.

According to exemplary embodiments of the present inventive concepts, a semiconductor device may comprise: a semiconductor substrate including an integrated circuit formed therein; an interlayer dielectric layer on the semiconductor substrate to cover the integrated circuit; an intermetal dielectric layer that is provided on the interlayer dielectric layer and is electrically connected to integrated circuit, the intermetal dielectric layer including at least one metal line; and a through electrode that vertically penetrates the interlayer dielectric layer and the semiconductor substrate, the through electrode being electrically connected to the at least one metal line formed therein. The through electrode may include a top end that faces the at least one of the metal line. The top end of the through electrode may be capped with a first protection layer capable of preventing a constituent of the through electrode from being diffused away from the through electrode.

In some embodiments, the at least one metal line may comprise: a first metal line that is provide on the interlayer dielectric layer and is connected to the through electrode; and a second metal line that is provided on the first metal line and is connected to the first metal line. The first protection layer may be provided on the top end of the through electrode and is not provided on the interlayer dielectric layer.

In some embodiments, the first metal line may be connected to the first protection layer.

In some embodiments, the first metal line may penetrate the first protection layer to be connected to the top end of the through electrode.

In some embodiments, the first protection layer may comprise a top surface whose level is substantially same as or higher than a top surface of the interlayer dielectric layer.

In some embodiments, the semiconductor device may further comprise a second protection layer provided on the first protection layer to be self-aligned with the through electrode or the first protection layer.

In some embodiments, the at least one metal line may comprise: a first metal line that is provided on the interlayer dielectric layer and is connected to the through electrode; and a second metal line that is provided on the first metal line and is connected to the first metal line. The second protection layer may be provided on the first protection layer and is not provided on the interlayer dielectric layer.

In some embodiments, the first metal line may penetrate the second protection layer to be connected to the first protection layer.

In some embodiments, the first metal line may penetrates the second protection layer and further penetrate the first metal line to be connected to the top end of the through electrode.

In some embodiments, the second protection layer may include a top surface whose level is substantially same as or higher than a top surface of the interlayer dielectric layer. The first protection layer may include a top surface whose level is lower than the top surface of the interlayer dielectric layer.

In some embodiments, the through electrode may include copper. The first protection layer may include a combination of copper and silicon. The second protection layer may include the combination of copper and silicon and further include nitrogen.

In some embodiments, the first protection layer may comprise a conductive material including metal which is a constituent of the through electrode. The second protection layer may comprise an insulating material including the metal.

In some embodiments, at least one metal line may comprise: a first metal line that is provided on the interlayer dielectric layer and is connected to the through electrode; and a second metal line that is provided on the first metal line and is connected thereto.

In some embodiments, the intermetal dielectric layer may comprise: a first insulation layer that is provided on the interlayer dielectric layer and includes the first metal line formed therein; a second insulation layer that is provided on the first insulation layer and includes the second metal line formed therein; and a capping layer that is provided between the first insulation layer and the second insulation layer and covers the first metal line. The capping layer may be not provided on the interlayer dielectric layer.

According to exemplary embodiments of the present inventive concepts, a method for fabricating a semiconductor may comprise: providing a semiconductor substrate including an integrated circuit formed therein; forming an interlayer dielectric layer on the semiconductor substrate to cover the integrated circuit; forming a through electrode that penetrates the interlayer dielectric layer and the semiconductor substrate and includes an exposed top surface; providing a first reaction gas to the exposed top surface of the through electrode so as to change a top portion including the exposed top surface of the through electrode into a first protection layer that is self-aligned with the through electrode; and forming an intermetal dielectric layer on the interlayer dielectric layer to be electrically connected to the through electrode.

In some embodiments, the method may further comprise plasma cleaning the exposed top surface of the through electrode, before the providing of the first reaction gas.

In some embodiments, the providing of the first reaction gas may comprise providing silane ($SiH_4$) to the exposed top surface of the through electrode so as to react the silane with metal of the through electrode. The forming of the first protection layer may comprise changing the top portion of the through electrode into a conductive layer including silicon and the metal of the through electrode.

In some embodiments, the conductive layer may be formed in the through electrode and not extend toward a top surface of the interlayer dielectric layer. A top surface of the conductive layer may have a level substantially same as or higher than the top surface of the interlayer dielectric layer.

In some embodiments, the method may further comprise providing a second reaction gas to an exposed top surface of the first protection layer so as to change a top portion including the exposed top surface of the first protection layer into a second protection layer that is self-aligned with the through electrode.

In some embodiments, the providing of the second reaction gas may comprise providing ammonia ($NH_3$) to the exposed top surface of the first protection layer to react the ammonia with metal of the first protection layer. The forming of the second protection layer may comprise changing the top portion of the first protection layer into an insulation layer including nitrogen and the metal of the first protection layer.

In some embodiments, the insulation layer may be formed in the first protection layer and does not extend toward a top surface of the interlayer dielectric layer. A top surface of the insulation layer may have a level substantially same as or higher than the top surface of the interlayer dielectric layer. The top surface of the first protection layer may have a level lower than the top surface of the interlayer dielectric layer.

BRIEF DESCRIPTION OF THE DRAWINGS

The foregoing and other features and advantages of exemplary embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIG. 2C is a cross-sectional view illustrating another embodiment of FIG. 2B;

FIGS. 2E is a cross-sectional view illustrating another embodiment of FIG. 2D;

DETAILED DESCRIPTION OF EXEMPLARY EMBODIMENTS

Figure 1A:
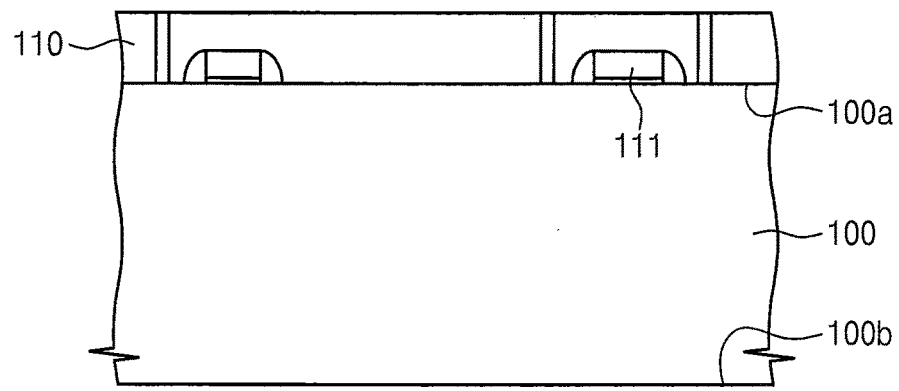
FIGS. 1A to 1I are cross-sectional views illustrating a method for fabricating a semiconductor device according to exemplary embodiments of the present inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements. Hereinafter, it will be described about an exemplary embodiment of the present invention in conjunction with the accompanying drawings.

FIGS. 1A to 1I are cross-sectional views illustrating a method for fabricating a semiconductor device according to exemplary embodiments of the present inventive concepts. FIG. 1J is a cross-sectional view illustrating a portion of FIG. 1I. FIGS. 1K to 1M are cross-sectional views illustrating various additional possible modifications to the embodiments of FIG. 1J. FIGS. 2A to 2E are cross-sectional views illustrating a method for forming a protection layer according to exemplary embodiments of the present inventive concepts. FIG. 2C is a cross-sectional view illustrating another embodiment of FIG. 2B. FIGS. 2E is a cross-sectional view illustrating another embodiment of FIG. 2D. FIG. 2F is a cross-sectional view illustrating a method for forming a protection layer according to exemplary embodiments of the present inventive concepts. FIG. 2G is an enlarged cross-sectional view illustrating a portion of FIG. 2F.

Referring to FIG. 1A, a semiconductor substrate 100 may be provided to include a top surface 100a and a bottom surface 100b facing each other. An interlayer dielectric layer 110 having an integrated circuit 111 provided therein may be formed on the top surface 100a of the semiconductor substrate 100. The semiconductor substrate 100 may be a wafer including semiconductor such as silicon. The integrated circuit 111 may include a memory circuit, a logic circuit, or a combination thereof. The interlayer dielectric layer 110 may include a silicon oxide layer or a silicon nitride layer. The interlayer dielectric layer 100 may be, for example, a TEOS (tetraethylorthosilicate) oxide layer formed by a chemical vapor deposition.

Figure 1B:
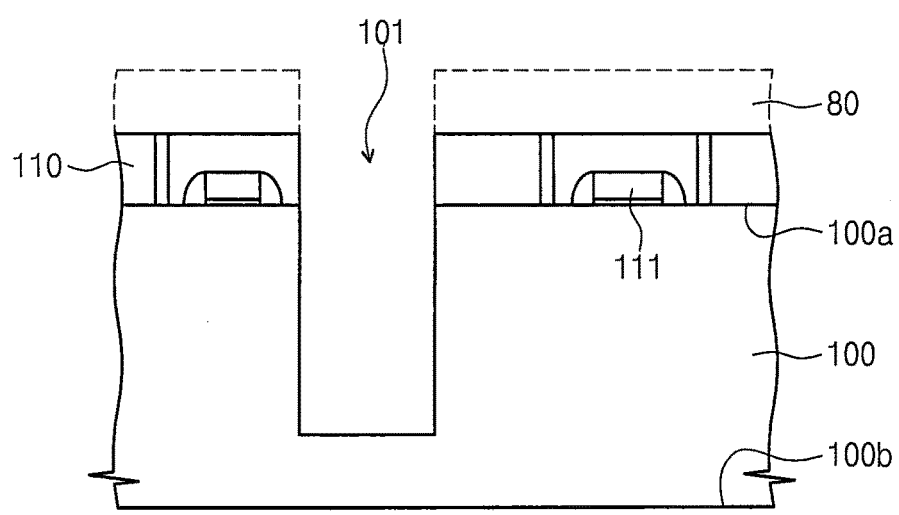

Referring to FIG. 1B, a mask layer 80 may be formed on the interlayer dielectric layer 110, and a via-hole 101 may be formed by an etching process using the mask layer 80 as an etch mask. For example, the mask layer 80 may be formed by coating and patterning a photoresist. The via-hole 101 may not reach the bottom surface 100b of the semiconductor substrate 100. The mask layer 80 may be removed by an ashing process.

Figure 1C:
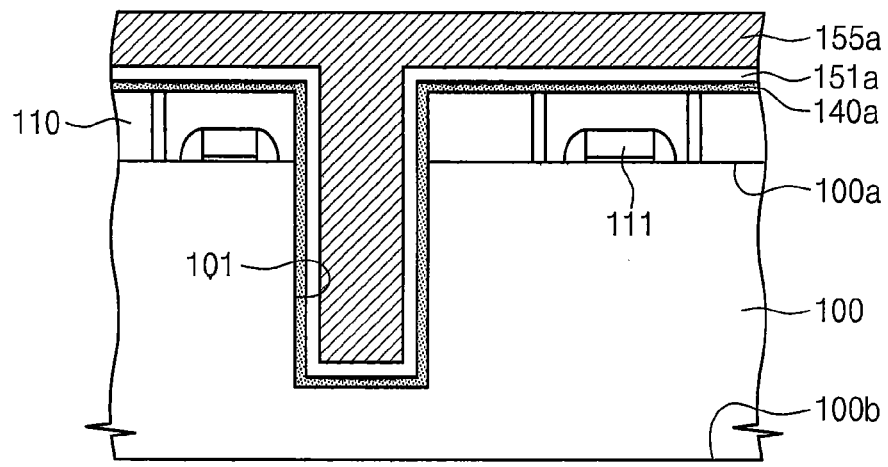

Referring to FIG. 1C, a silicon oxide layer may be formed by a chemical vapor deposition to form an insulation layer 140a that covers inner side surface of the via-hole 101 and a top surface of the interlayer dielectric layer 110. A conductive layer 155a may be formed on the semiconductor substrate 100 to fill the via-hole 101. The insulation layer 140a may be formed by depositing HARP (high aspect ratio process) oxide using an SACVD (sub-atmospheric chemical vapor deposition). The conductive layer 155a may be formed by depositing or plating polysilicon, copper, tungsten, aluminum, etc.

When the conductive layer 155a is formed of copper or copper-containing conductive material, a metal layer 151a may be further formed on the insulation layer 140a to prevent copper from being diffused. The metal layer 151a may be formed to have a shape extending along the insulation layer 140a by depositing titanium (Ti), titanium nitride (TiN), chromium (Cr), tantalum (Ta), tantalum nitride (TaN), nickel (Ni), tungsten (W), tungsten nitride (WN), or any combination thereof.

After the formation of the conductive layer 155a, a planarization process may be performed to expose the interlayer dielectric layer 110. In some embodiments, a chemical mechanical polishing process may be performed until the interlayer dielectric layer 110 is exposed.

Figure 1D:
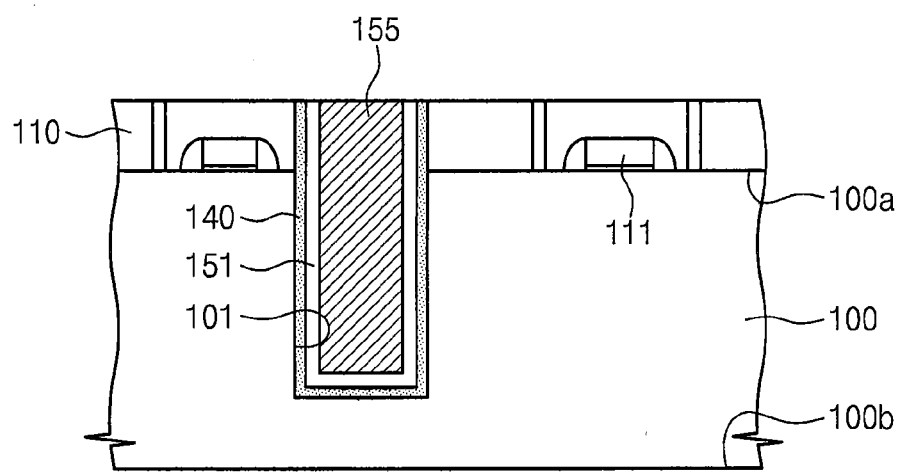

Referring to FIG. 1D, the planarization process may change the insulation layer 140a and the conductive layer 155a into a via-insulation layer 140 and a through electrode 155, respectively. The through electrode 155 may completely penetrate the interlayer dielectric layer 110 and partially penetrate the semiconductor substrate 100. The via-insulation layer 140 may have a shape surrounding side and bottom surfaces of the through electrode 155. When the metal layer 151a is further formed, the planarization process may change the metal layer 151a into a barrier layer 151 that prevents a constituent (for example, copper) of the through electrode 155 from being diffused into the semiconductor substrate 100 and/or the integrated circuit 111.

Figure 1E:
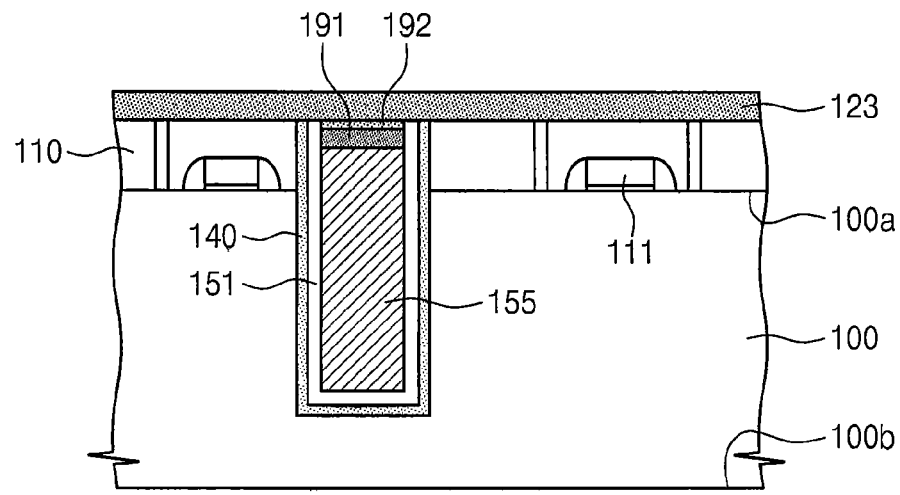

Referring to FIG. 1E, a first protection layer 191 may be formed on the through electrode 155, and a low-k insulation layer 123 that covers the interlayer dielectric layer 110 and the first protection layer 191. The low-k insulation layer 123 may include a low-k or ultra low-k insulating material having a dielectric constant less than that of silicon dioxide ($SiO_2$). The low-k insulation layer 123 may have a dielectric constant, for example, of about 1.8 to about 3.5. The low-k insulation layer 123 may include fluorine-doped silicon dioxide, carbon-doped silicon dioxide, porous silicon dioxide, silicone based polymeric dielectric such as HSG (hydrogen silsesquioxane) or MSG (methylsilsesquioxane), organic polymeric dielectric such as polyimide, SiCOH, SILK™ commercially available from The Dow Chemical Company, or AURORA™ commercially available from ASM.

A second protection layer 192 may be further formed on the first protection layer 191. The first protection layer 191 may be formed by depositing a conductive material in a self-align manner, and the second protection layer 192 may be formed by depositing an insulating material in a self-align manner. Alternatively, the first protection layer 191 may be formed of a conductive material or an insulating material without forming the second protection layer 192. The formations of the first and second protection layers 191 and 192 will be described below in detail with reference to FIGS. 2A to 2G.

Figure 2A:
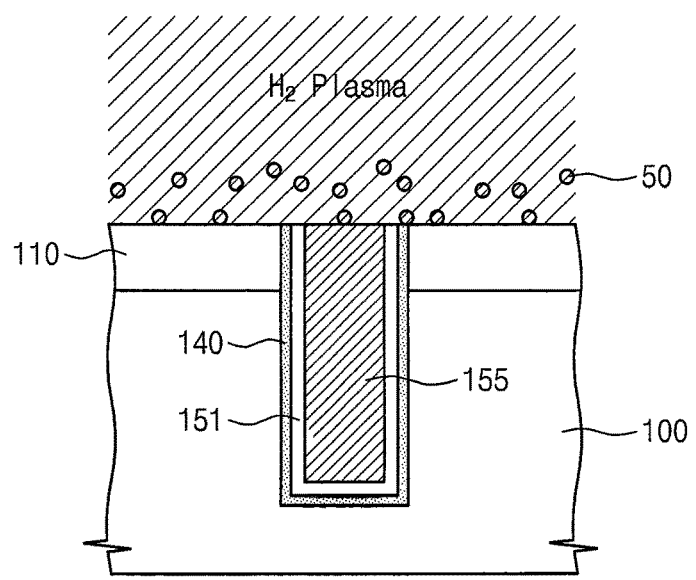
FIGS. 2A to 2E are cross-sectional views illustrating a method for forming a protection layer according to exemplary embodiments of the present inventive concepts.

Referring to FIG. 2A, a cleaning process may be selectively performed before the formation of the first protection layer 191. For example, the through electrode 155 may be exposed by a chemical mechanical polishing process, as illustrated in FIGS. 1C and 1D, and particles 50 such as oxide (e.g., CuO) may be formed on the exposed surface of the through electrode 155. The particles 50 may be removed by the cleaning process. The cleaning process may be a plasma cleaning using $UV/O_3$ plasma, $O_2$ plasma, $H_2$ plasma, Ar plasma, or any combination thereof. For example, the particles 50 may be removed by a plasma cleaning using the $H_2$ plasma.

Figure 2B:
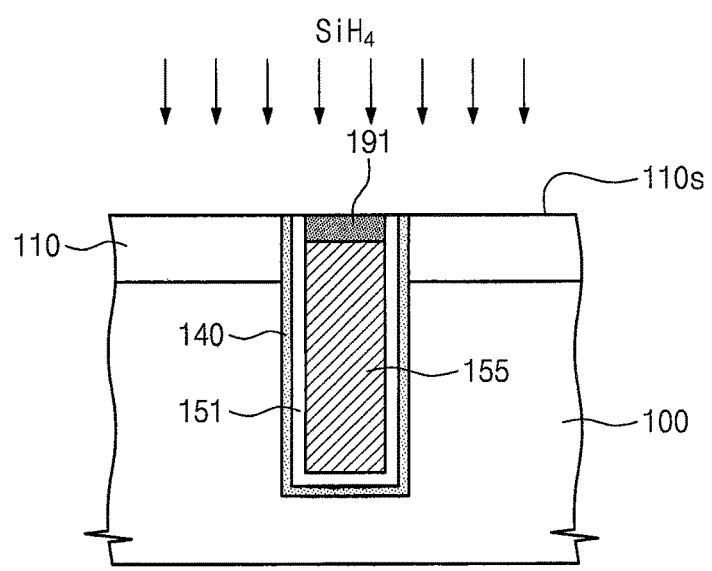
Figure 2C:
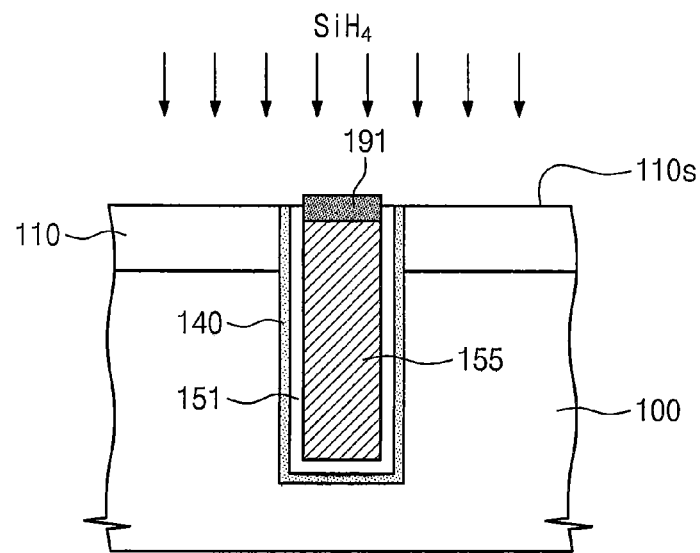

Referring to FIG. 2B, the first protection layer 191 may be formed to cover the through electrode 155. The first protection layer 191 may include a conductive material capable of preventing a constituent (ex. Cu) of the through electrode 155 from being moved away from the through electrode 155 and not causing a decrease in the resistivity of the through electrode 155.

For example, a first reaction gas such as $SiH_4$, $GeH_4$, $PH_3$, $B_2H_6$, $AsH_3$, or $C_xH_y$ may be provided to the semiconductor substrate 100 such that a top portion of the through electrode 155 may be transformed into a layer including Cu—Si, Cu—Ge, Cu—P, Cu—B, Cu—As, Cu—C, etc. In case the through electrode 155 is formed of copper, $SiH_4$ may be provided to the semiconductor substrate 100 to change the top portion of the through electrode 155 into the first protection layer 191 including $CuSi_x$. The first protection layer 191 may be formed by a deposition process such as PECVD. In some embodiments, the first reaction gas may react with a metallic constituent of the through electrode 155 such that the exposed top portion of the through electrode 155 may be changed into the first protection layer 191. In other words, the first protection layer 191 may be formed to be self-aligned with the through electrode 155. Since the first protection layer 191 may be formed restrictedly on the exposed top portion of the through electrode 155, the first protection layer 191 may hot protrude from a top surface 110s of the interlayer dielectric layer 110. Alternatively, as illustrated in FIG. 2C, the first protection layer 191 may protrude from the top surface 110s of the interlayer dielectric layer 110.

Figure 2D:
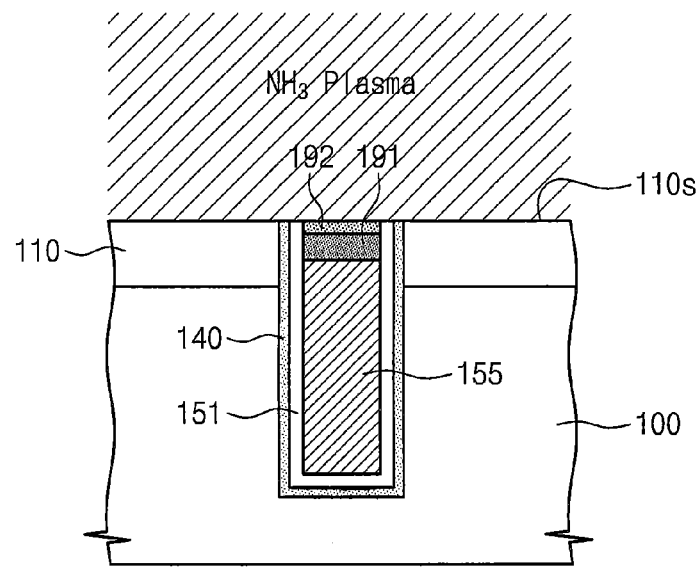
Figure 2E:
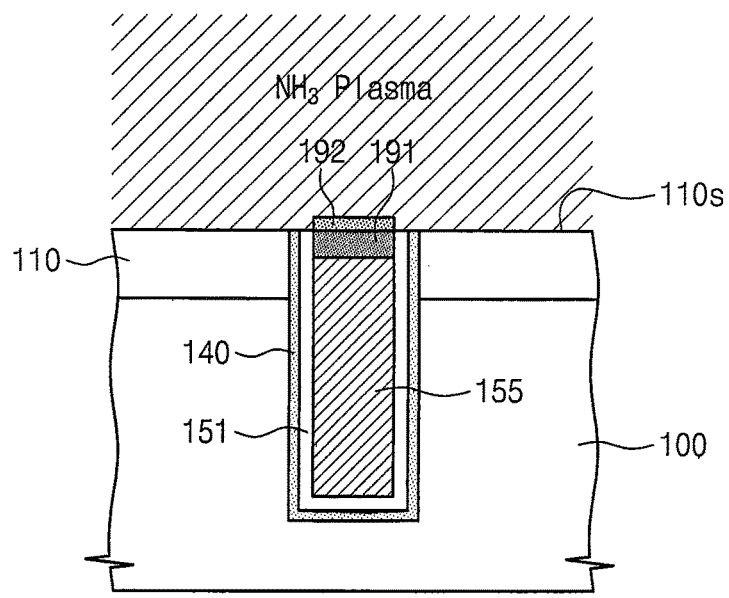
Figure 2F:
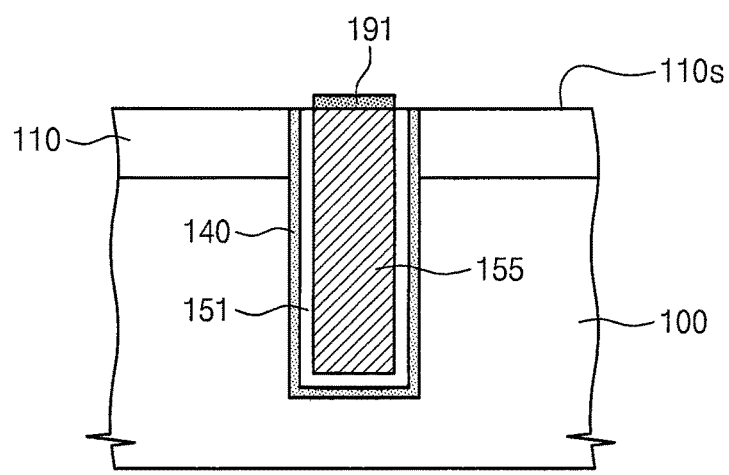
FIG. 2F is a cross-sectional view illustrating a method for forming a protection layer according to exemplary embodiments of the present inventive concepts.
Figure 2G:
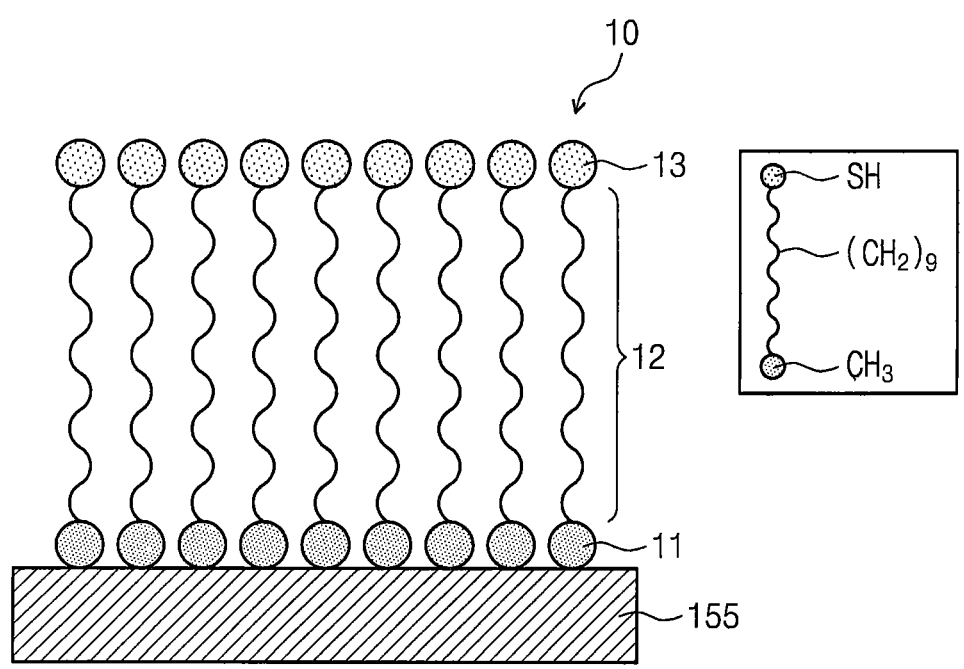
FIG. 2G is an enlarged cross-sectional view illustrating a portion of FIG. 2F.

Referring to FIG. 2D, the second protection layer 192 may be further formed on the first protection layer 191. For example, a second reaction gas such as $N_2$, $NH_3$, or $C_xH_y$ may be provided to the semiconductor substrate 100 having the first protection layer 191 formed therein. As a result, a top portion of the first protection layer 191 may be changed into the second protection layer 192 including a constituent of the second reaction gas.

In some embodiments, $NH_3$ may be provided to the semiconductor substrate 100 to change the top portion of the first protection layer 191 into the second protection layer 192 including $CuSi_xN_y$. The second protection layer 192 may be formed by a deposition process such as PECVD. The second reaction gas may react with a metallic constituent of the first protection layer 191 such that the second protection layer 192 may be formed to be self-aligned with the first protection layer 191. Since the second protection layer 192 may be formed restrictedly on the top portion of the first protection layer 191, the second protection layer 192 may not protrude from the top surface 110s of the interlayer dielectric layer 110.

Alternatively, as illustrated in FIG. 2E, the second protection layer 192 may protrude from the top surface 110s of the interlayer dielectric layer 110. In case the second protection layer 192 is further formed, a top surface of the first protection layer 191 may have a level lower than or substantially same as the top surface 110s of the interlayer dielectric layer 110.

The cleaning process for removing the particles 50, the formation of the first protection layer 191, and the formation of the second protection layer 192 may be in situ performed in a single processing chamber at the same temperature condition, e.g., about 200° C. to about 300° C. Alternatively, the cleaning process for removing the particles 50, the formation of the first protection layer 191, and the formation of the second protection layer 192 may be separately performed in respective chambers at different temperature conditions or at substantially same temperature condition.

Differently, as illustrated in FIG. 2F, the first protection layer 191 may be formed to selectively cover the through electrode 155 by an electroless cobalt treatment or a self-aligned monomer treatment. The first protection layer 191 may protrude from the top surface 110s of the interlayer dielectric layer 110.

As one example of the electroless cobalt treatment, the first protection layer 191 may be formed by an electroless cobalt treatment in which cobalt salt (e.g., cobalt sulfate, cobalt chloride), DMAB (dimethylamineborane), or borohydride may be used as a reducing agent. In the electroless cobalt treatment, a complexing agent (e.g., citric acid), a stabilizer (e.g., imidazole), and pH regulator (e.g., KOH) may be added to the reducing agent. In this case, the first protection layer 191 may be formed of a cobalt layer.

As one example of the self-aligned monomer or self-assembled monolayer treatment, in case the through electrode 155 is formed of copper, a self-assembled monolayer (referred to hereinafter as SAM) may be provided to the semiconductor substrate 100 to change the top portion of the through electrode 155 into the first protection layer 191. In this case, the first protection layer 191 may be formed of an organic layer.

Referring to FIG. 2G, the SAM 10 may include a head group 11, a hydrocarbon chain 12, and a terminal group 13. The head group 11 may strongly combine with metal but weakly combine with an insulating material, while the terminal group 13 may weakly combine with metal and an insulating material. For example, the head group 11 may include $CH_3$ or H group, and the terminal group 13 may include SH group. The hydrocarbon chain 12 may affect packing density and crystallinity of a monolayer. The hydrocarbon chain 12 may include alkyl chain represented as —(CH2)n—. For example, the SAM 10 may be $CH_3(CH_2)_9SH$ or C10 (decanethiol).

When the SAM 10 is provided on the semiconductor substrate 100, the head group 11 may selectively combine with metal (e.g., Cu) of the through electrode 155. According to the self-aligned monomer treatment, the SAM 10 may be provided (or deposited) on the through electrode 155 as illustrated in FIG. 2G, and thus the first protection layer 191 as an organic layer may be formed.

Figure 1F:
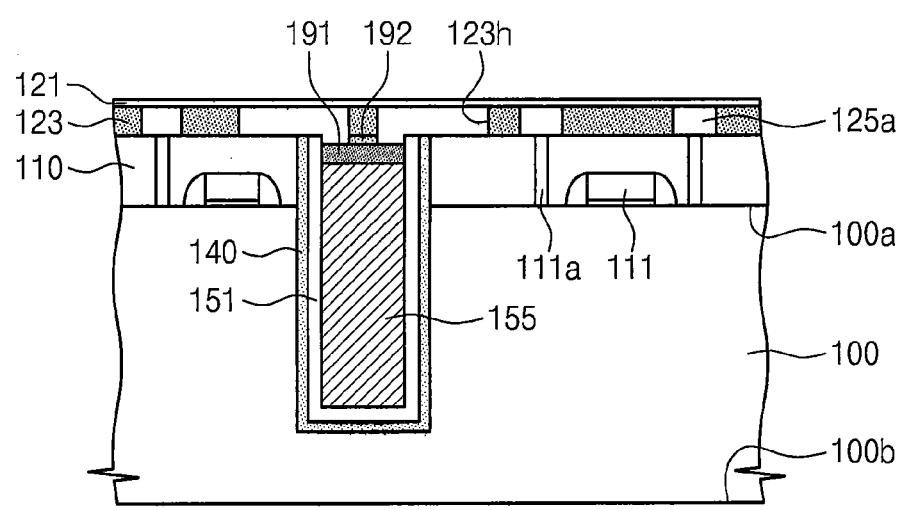

Referring to FIG. 1F, one or more first metal lines 125a may be formed to electrically connect the through electrode 155 to the integrated circuit 111 by a damascene process (e.g., a single damascene process). In some embodiments, the low-k insulation layer 123 may be patterned by an etching process to form one or more openings 123h, and the first metal lines 125a may be formed by filling the openings 123h with metal (e.g., copper) using deposition and planarization processes. At least one of the metal lines 125a may penetrate the second protection layer 192 to be coupled to the first protection layer 191 such that the at least one of the metal lines 125a may be electrically connected to the through electrode 155. Ones of the metal lines 125a may be coupled to contact plugs 111a that penetrate the interlayer dielectric layer 110 such that the ones of the metal lines 125a may be electrically connected to the integrated circuit 111.

After forming the first metal lines 125a, a capping layer 121 may be formed to cover the first metal lines 125a and the low-k insulation layer 123. The capping layer 121 may include a low-k material capable of preventing metal constituents of the first metal lines 125a from being diffused. The capping layer 121 may include, for example, SiCN.

Figure 1G:
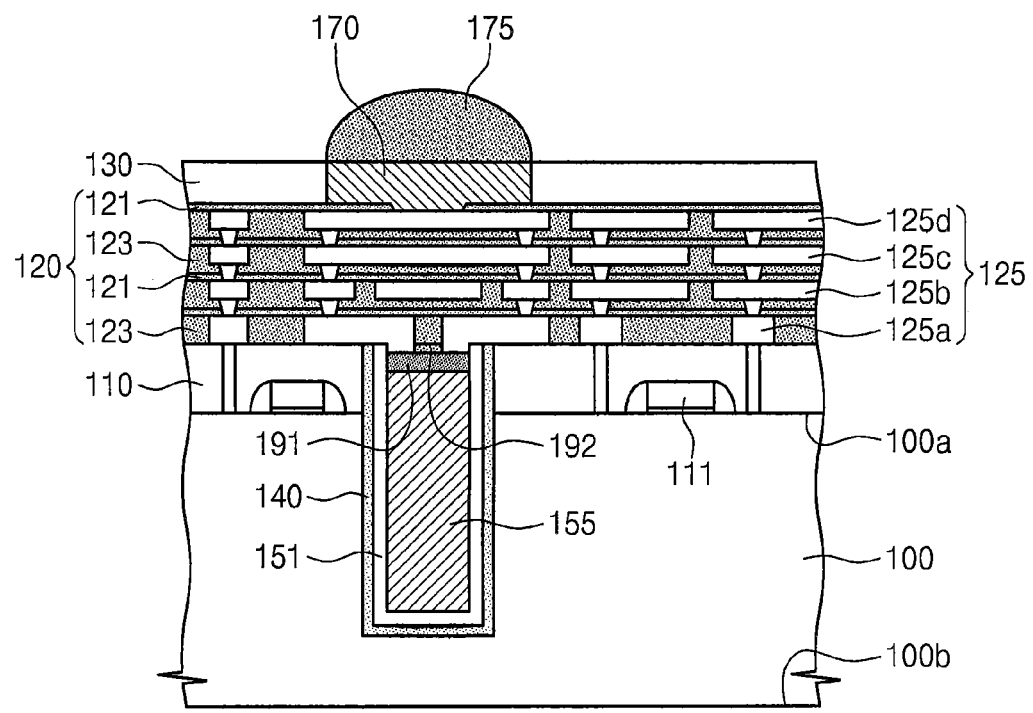

Referring to FIG. 1G, a plurality of low-k insulation layers 123 and a plurality of capping layers 121 may be alternatingly stacked to form an intermetal dielectric layer 120. Second metal lines 125b, third metal lines 125c, and fourth metal lines 125d that are electrically connected to the first metal lines 125a may be sequentially formed to create a multi-layered metal line 125. The second to fourth metal lines 125b, 125c and 125d may be formed by a damascene process (e.g., a double damascene process).

An upper insulation layer 130 may be formed on an uppermost capping layer 121, and an upper line 170 may be formed to be electrically connected to the metal line 125. An upper terminal 175 such as a solder ball may be formed on the upper insulation layer 130 to be electrically connected to the upper line 170. The upper terminal 175 may be formed of lead-free solder. The upper insulation layer 130 may be formed by depositing silicon oxide or silicon nitride identical or similar to the formation of the interlayer dielectric layer 110.

Figure 1H:
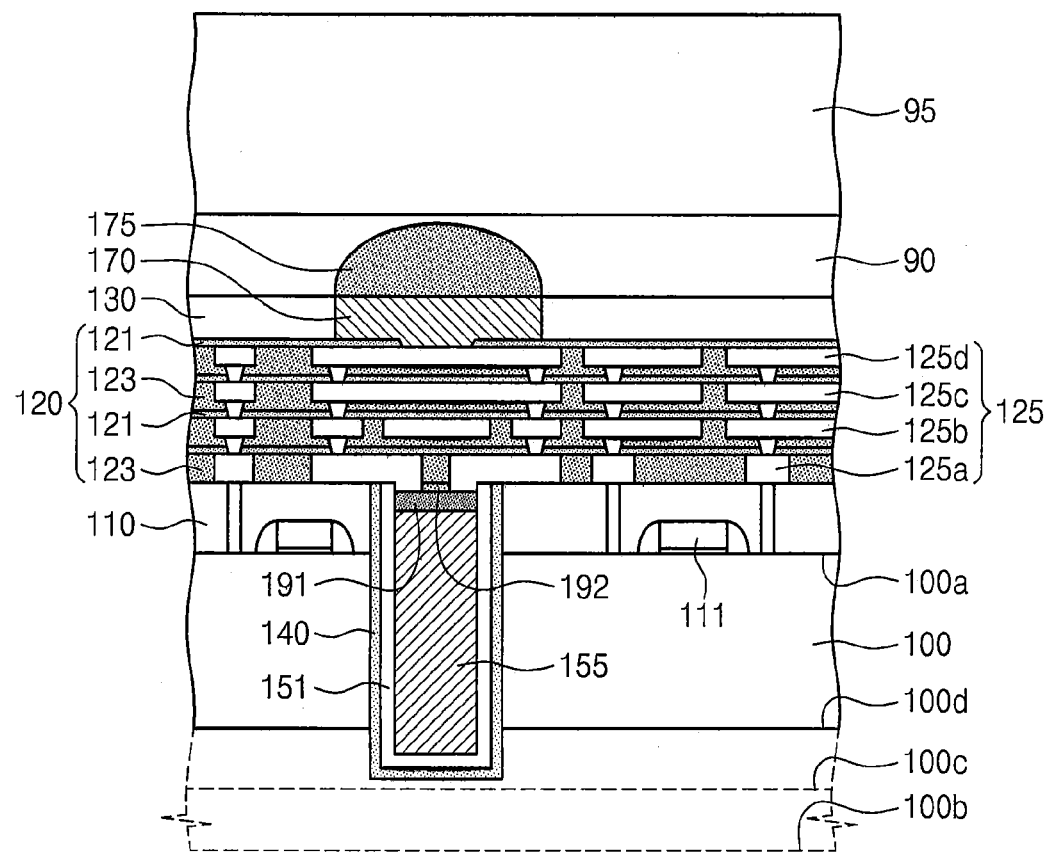

Referring to FIG. 1H, the semiconductor substrate 100 may be recessed until the through electrode 155 protrudes. For example, the bottom surface 100b of the semiconductor substrate 100 may be recessed by at least one of an etching process, a chemical mechanical polishing process and a grinding process which uses an etchant or slurry capable of selectively removing a constituent (e.g., silicon) of the semiconductor substrate 100. The recess process may be performed until a third bottom surface 100d is emerged. The third bottom surface 100d may be more adjacent to the top surface 100a than the bottom surface 100b, and the through electrode 155 may protrude from the third bottom surface 100d.

For example, the bottom surface 100b of the semiconductor substrate 100 may be chemically mechanically polished to emerge a second bottom surface 100c through which the through electrode 155 is not exposed, and the second bottom surface 100c may be then dry-etched to reveal the third bottom surface 100d through which the through electrode 155 is exposed.

The protruding process of the through electrode 155 may be performed under a condition that a carrier 95 is adhered to the top surface 100a of the semiconductor substrate 100 by an adhesive layer 90. The protruding process may be performed under a condition that the bottom surface 100b faces upward. The top surface 100a may be hereinafter referred to as an active surface, and the third bottom surface 100d may be hereinafter referred to as an inactive surface.

Figure 1I:
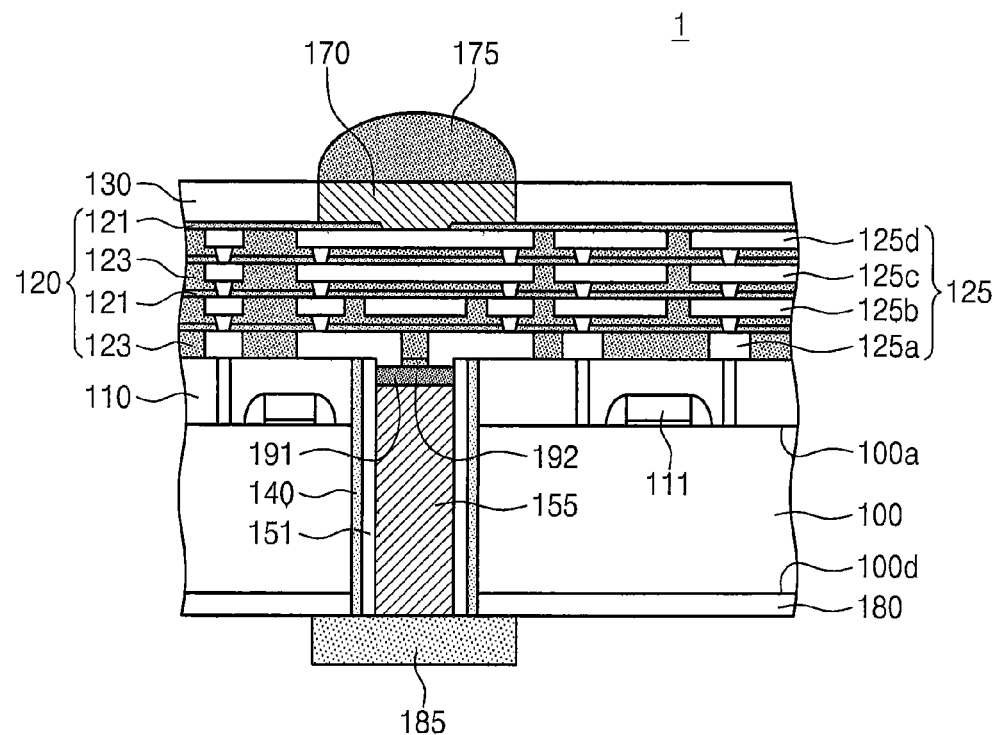
Figure 1J:
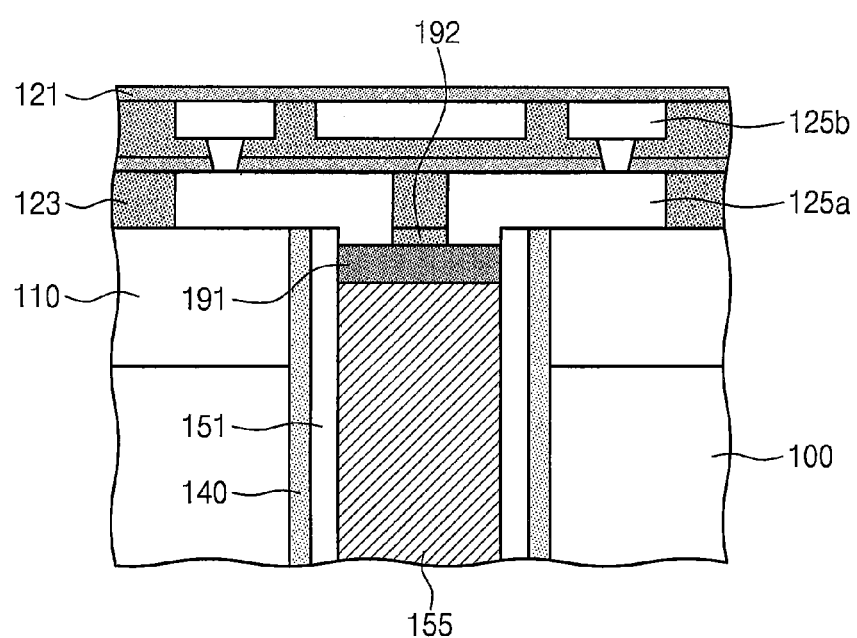
FIG. 1J is a cross-sectional view illustrating a portion of FIG. 1I.
Figure 1K:
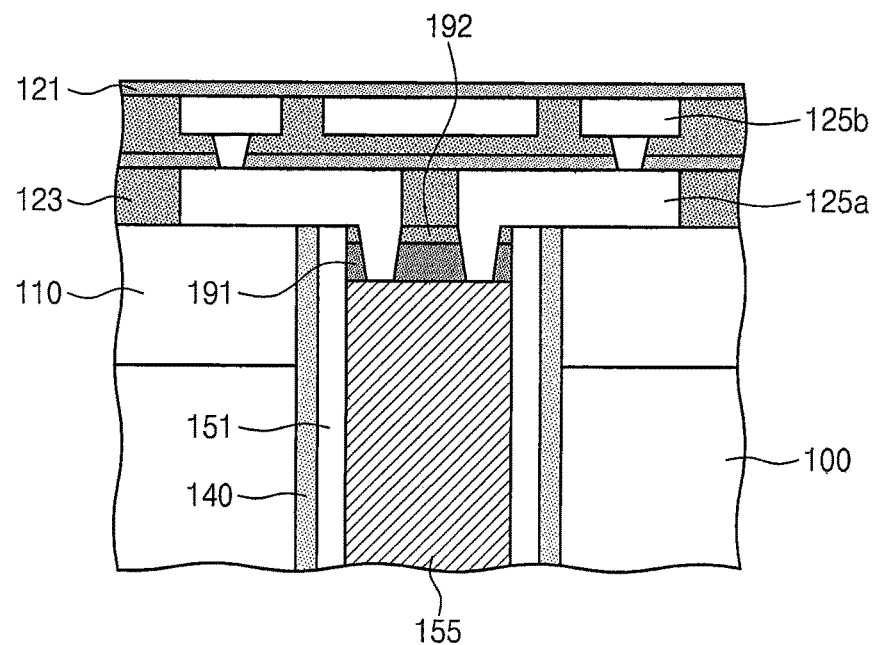
FIGS. 1K to 1M are cross-sectional views illustrating various additional possible modifications to the embodiments of FIG. 1J.
Figure 1L:
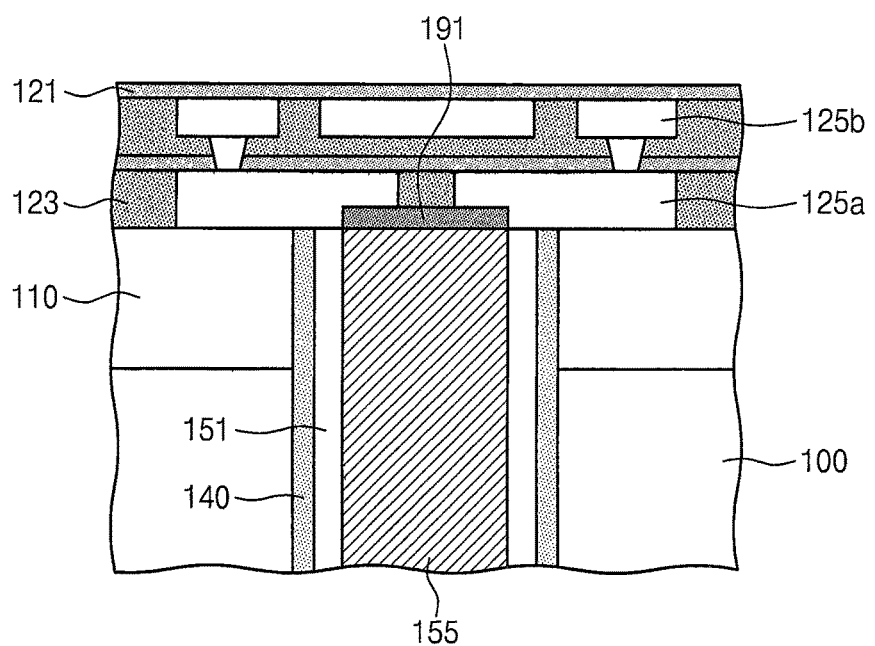
Figure 1M:
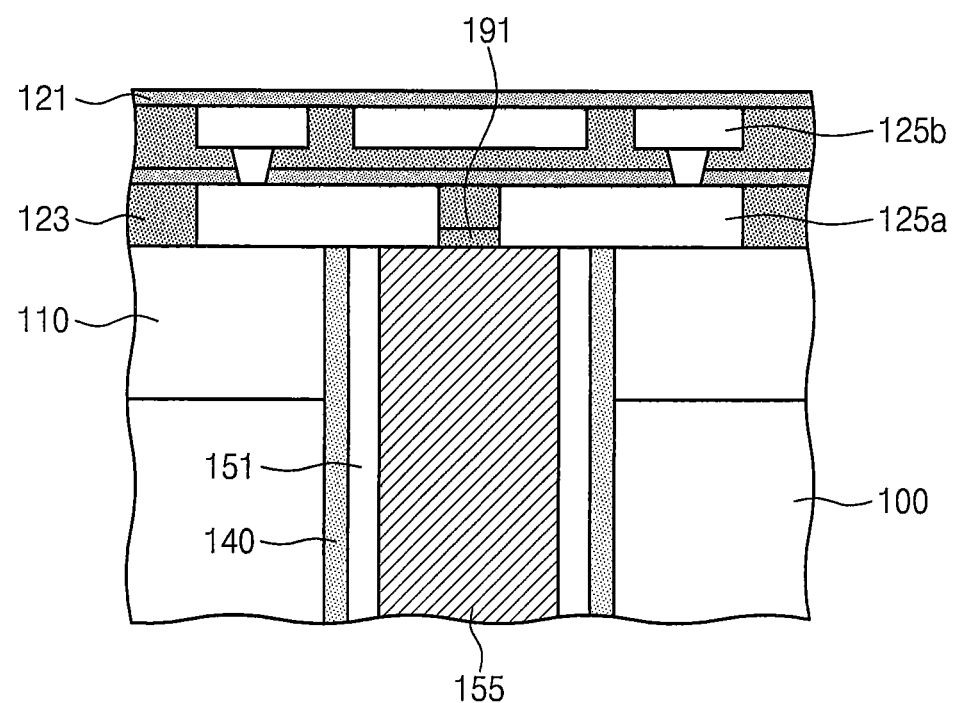

Referring to FIG. 1I, a lower insulation layer 180 may be formed on the inactive surface 100d of the semiconductor substrate 100. For example, a silicon oxide layer or silicon nitride layer may be deposited on the inactive surface 100d so as to cover the through electrode 155, and a chemical mechanical polishing process may be then performed on the silicon oxide layer or silicon nitride layer to form the lower insulation layer 180 having a planarized surface. A lower terminal 185 may be formed on the lower insulation layer 180 to be electrically connected to the through electrode 155. The lower terminal 185 may have a pad-shape or a solder ball-shape. The series of the processes described above may fabricate a semiconductor device 1 including the through electrode 155 that is covered by the self-aligned first protection layer 191 and the optional second protection layer 192.

In some embodiment, as illustrated in FIG. 1J, the capping layer 121 may not be formed on the interlayer dielectric layer 110. The self-aligned first protection layer 191 and the optional second protection layer 192 may be formed on the through electrode 155. The first metal layer 125a may penetrate the second protection layer 192 to be coupled to the first protection layer 191 such that the first metal layer 125a may be electrically connected to the through electrode 155. The second protection layer 192 may lie on the first protection layer 191 and between adjacent first metal lines 125a electrically connected to the through electrode 155.

Alternatively, as illustrated in FIG. 1K, the first metal line 125a may penetrate the second protection layer 192 and further penetrate the first protection layer 191. The first metal line 125a may therefore be directly connected to the through electrode 155.

Differently, as illustrated in FIG. 1L, the first protection layer 191 may be formed of cobalt by the electroless cobalt treatment as depicted in FIG. 2F. In this case, the second protection layer 192 may not be formed. The first metal line 125a may be coupled to the first protection layer 191 to be electrically connected to the through electrode 155.

Unlikely, as illustrated in FIG. 1M, the first protection layer 191 may be formed of an organic material by the self-assembled monolayer treatment as described in FIG. 2G. In this case, the second protection layer 192 may not be formed. The first metal line 125a may be coupled to the through electrode 155 to be electrically connected thereto.

FIGS. 3A, 4A, 5A and 6A are cross-sectional views illustrating other examples of FIG. 1I. FIGS. 3B, 4B, 5B and 6B are cross-sectional views illustrating portions of FIGS. 3A, 4A, 5A and 6A, respectively.

Figure 3A:
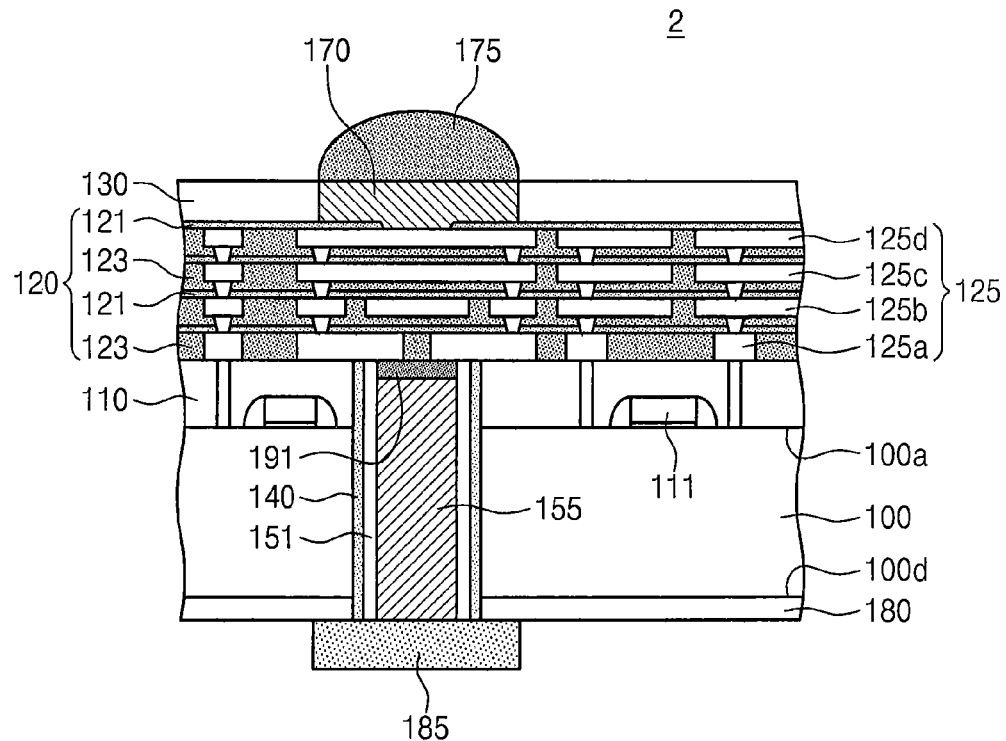
FIGS. 3A, 4A, 5A and 6A are cross-sectional views illustrating other examples of FIG. 1I.
Figure 3B:
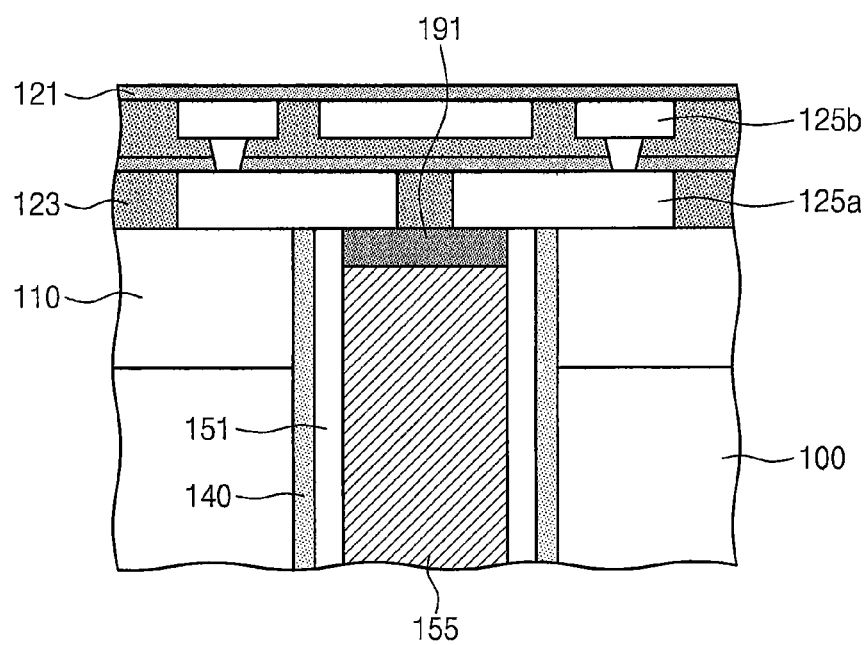
FIGS. 3B, 4B, 5B and 6B are cross-sectional views illustrating portions of FIGS. 3A, 4A, 5A and 6A, respectively.

Referring to FIG. 3A, a semiconductor device 2 may be fabricated to include the self-aligned first protection layer 191 that occupies the top portion of the through electrode 155 without the second protection layer 192. For example, the formation of the second protection layer 192 of FIGS. 2D or 2E may be skipped. In this case, as illustrated in FIG. 3B, the first metal line 125a may be directly connected to the first protection layer 191.

Figure 4A:
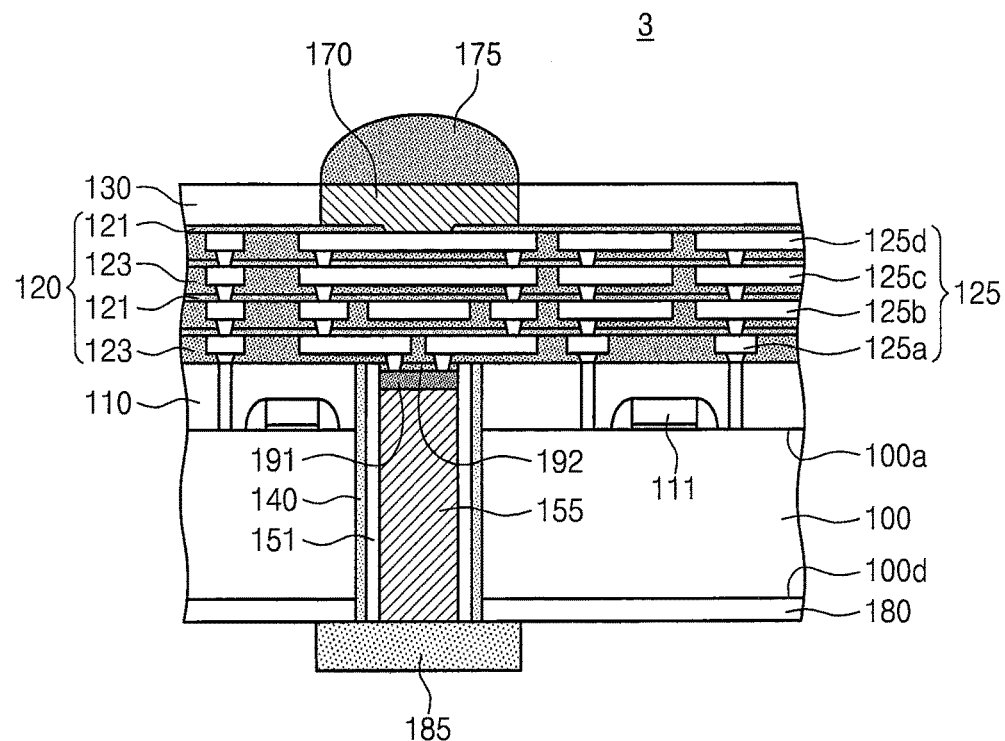
Figure 4B:
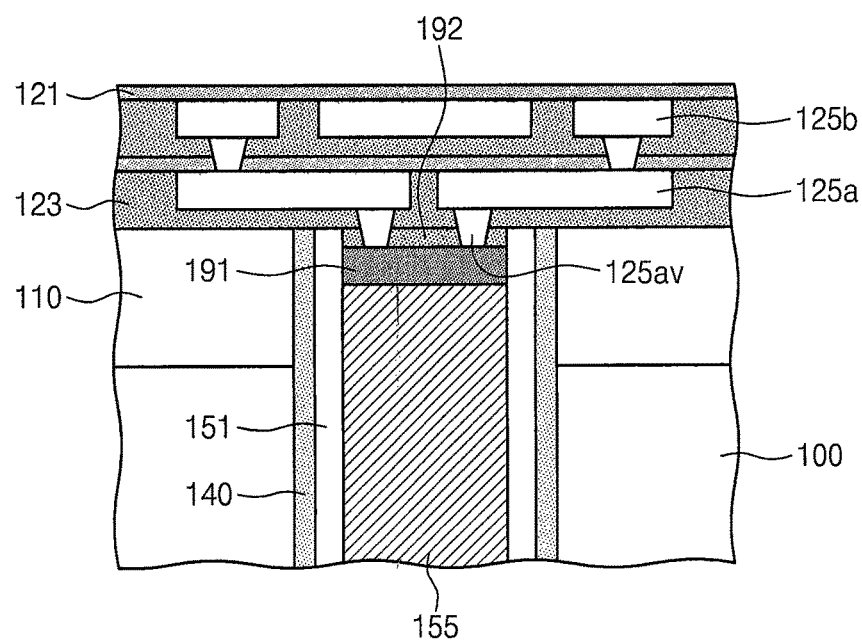

Referring to FIG. 4A, a semiconductor device 3 may be fabricated to include the first line 125a formed by a double damascene process. In this case, as illustrated in FIG. 4B, the first metal line 125a may not directly contact the interlayer dielectric layer 110. The first metal line 125a may include a via 125av that penetrates the second protection layer 192 to be coupled to the first protection layer 191.

Figure 5A:
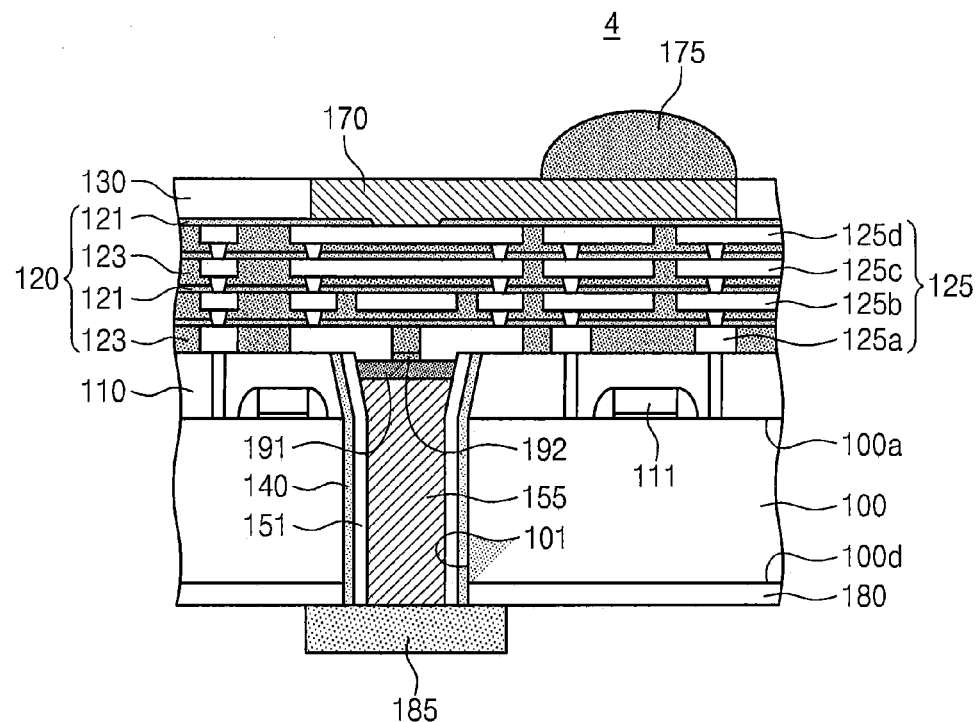
Figure 5B:
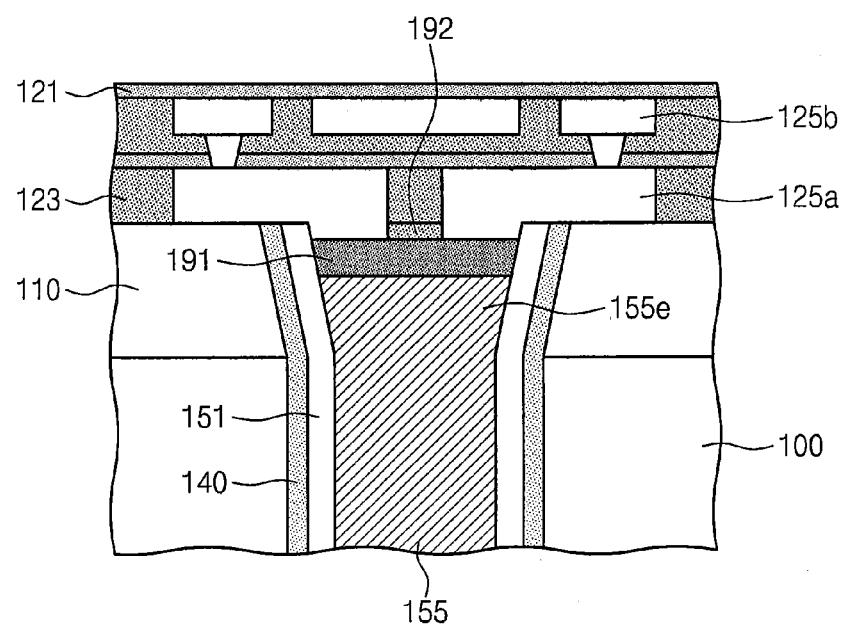

Referring to FIG. 5A, a semiconductor device 4 may be fabricated to include the through electrode 155 having an irregular width. For example, during the formation of the via-hole 101 by etching the interlayer dielectric layer 110 and the semiconductor substrate 100, the via-hole 101 may be formed to have an upper width greater than a lower width. The via-hole 101 may be filled with metal to form the through electrode 155 whose top end is wider than other portions. In this case, as illustrated in FIG. 5B, the first protection layer 191 may have relatively wide width. Consequently, a contact area between the first metal line 125a and the first protection layer 191 may be increased. The upper line 170 may be redistributed. Therefore, the upper terminal 175 may not be vertically aligned with the through electrode 155.

Figure 6A:
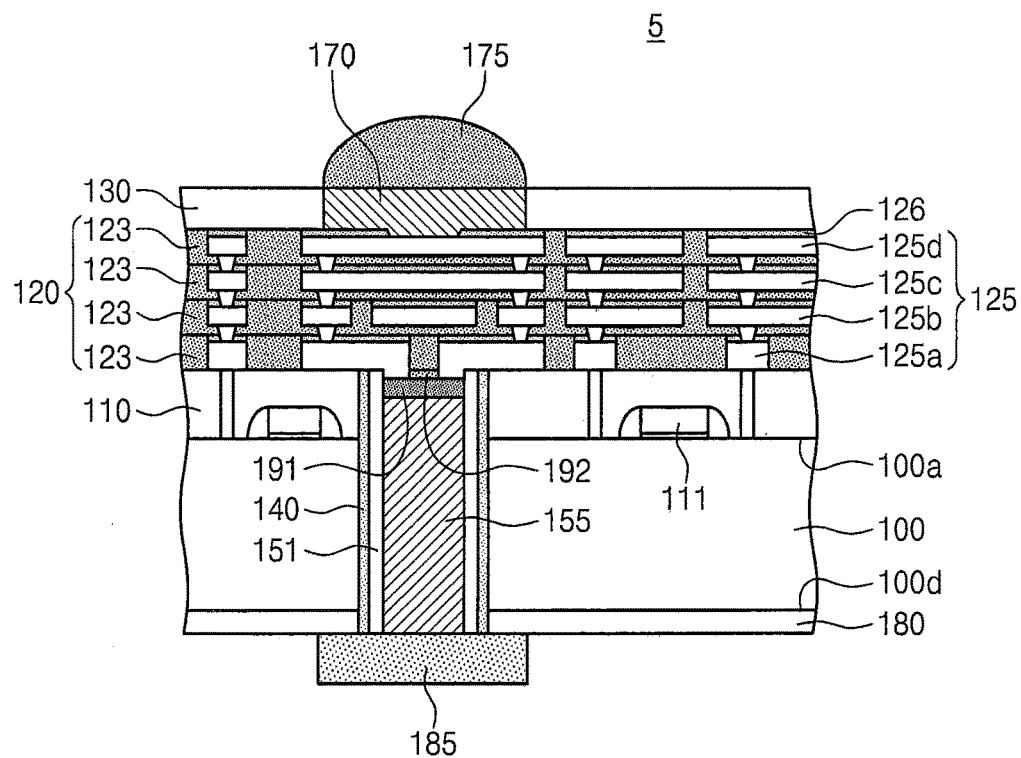

Referring to FIG. 6A, a semiconductor device 5 may be fabricated to include additional protection layers 126 instead of the capping layers 121. The additional protection layers 126 may protect the metal line 125 and be self-aligned therewith. For example, when forming the first to fourth metal lines 125a, 125b, 125c and 125d, the processes described with reference to FIGS. 2A to 2E may be performed to form the additional protection layers 126 self-aligned with the first to fourth metal lines 125a to 125d.

Figure 6B:
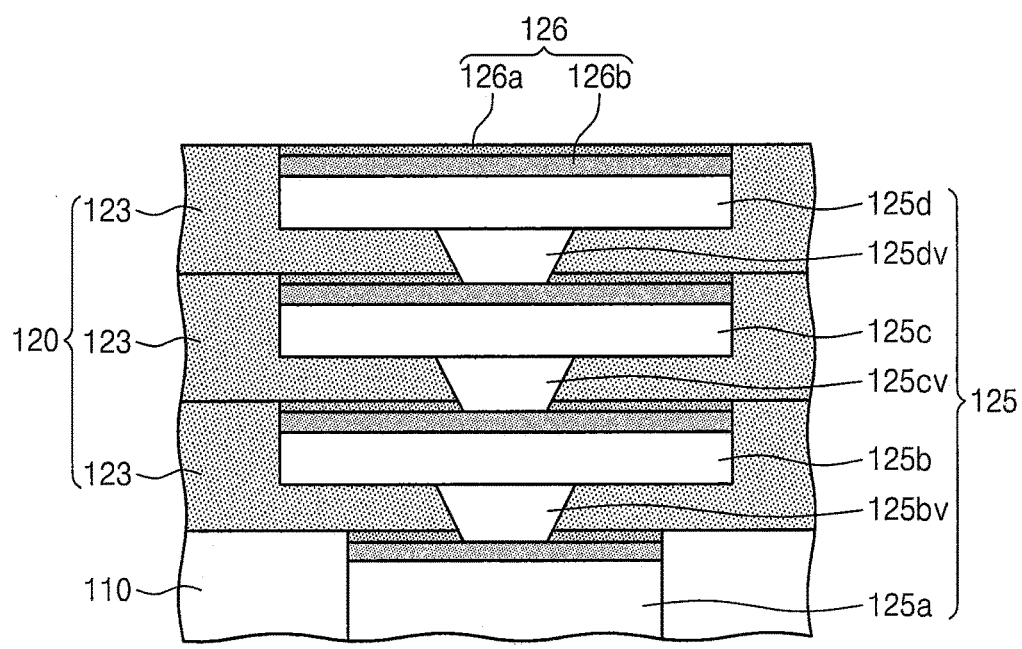

The additional protection layers 126 may include first protection layers 126a formed of a conductive material such as $CuSi_x$ and second protection layers 126b formed of an insulating material such as $CuSi_xN_y$ as illustrated in FIG. 6B. Alternatively, the additional protection layers 126 may have no second protection layers 126b. The second metal line 125b may have a via 125bv that penetrates the second protection layer 126b covering the first metal line 125a to be connected to the first metal line 125a. Similarly, the third metal line 125c may have a via 125cv connected to the second metal line 125b, and the fourth metal line 125d may have a via 125dv connected to the third metal line 125c.

Since the additional protection layers 126 are formed, the formations of the capping layers 121 may be skipped. Therefore, the intermetal dielectric layer 120 may include the low-k insulation layers 123 vertically stacked without the capping layers 121.

The previous descriptions regarding the methods for forming protection layers 191, 192 and 126 are also applicable to following embodiments.

FIGS. 7A to 7H are cross-sectional views illustrating a method for fabricating a semiconductor device according to exemplary embodiments of the present inventive concepts.

Figure 7A:
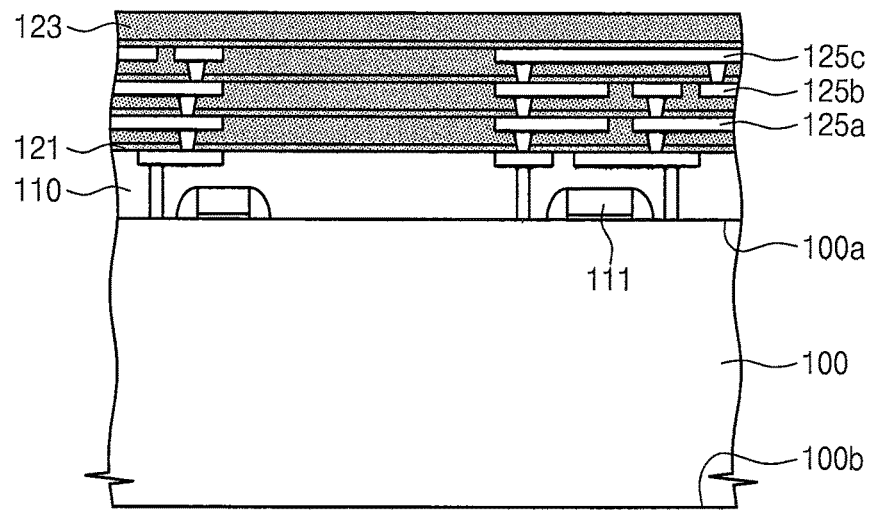
FIGS. 7A to 7H are cross-sectional views illustrating a method for fabricating a semiconductor device according to exemplary embodiments of the present inventive concepts.

Referring to FIG. 7A, the interlayer dielectric layer 110 including the integrated circuit 111 formed therein may be provided on the top surface 100a of the semiconductor substrate 100, and the capping layers 121 and the low-k dielectric layers 123 may be alternatingly stacked on the interlayer dielectric layer 110. The low-k dielectric layer 123s may include the first to third metal lines 125a, 125b and 125c formed therein. An uppermost layer on the semiconductor substrate 100 may be the low-k dielectric layer 123 or the capping layer 121. Although the present description is directed toward a case that the low-k dielectric layer 123 occupies the uppermost layer on the semiconductor substrate 100, this description is also identically or similarly applicable to a case that the capping layer 121 occupies the uppermost layer on the semiconductor substrate 100.

Figure 7B:
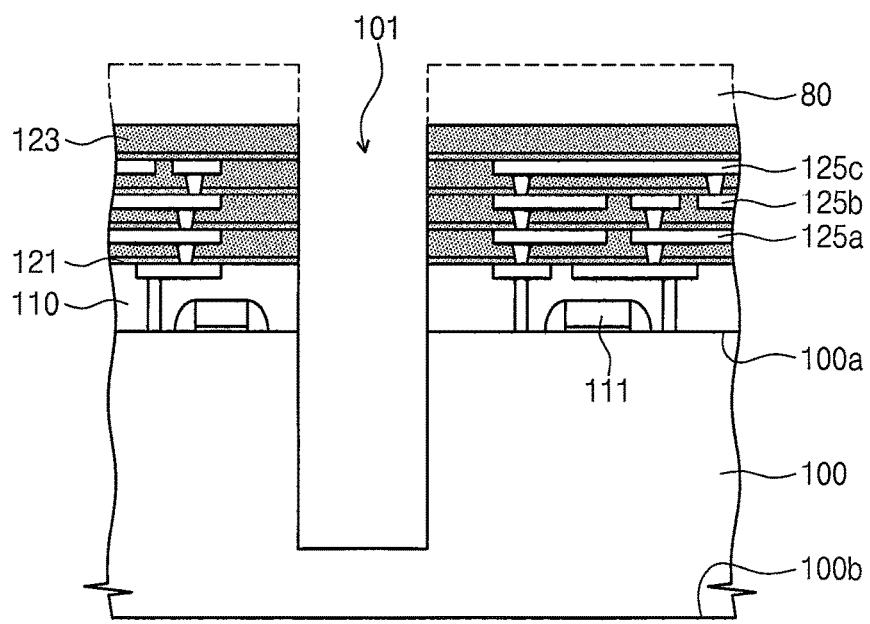

Referring to FIG. 7B, the mask layer 80 may be formed on an uppermost low-k dielectric layer 123, and the via-hole 101 may be formed by an etching process which uses the mask layer 80 as an etch mask. The via-hole 101 may not extend to the bottom surface 100b of the semiconductor substrate 100. The mask layer 80 may be removed by an ashing process.

Figure 7C:
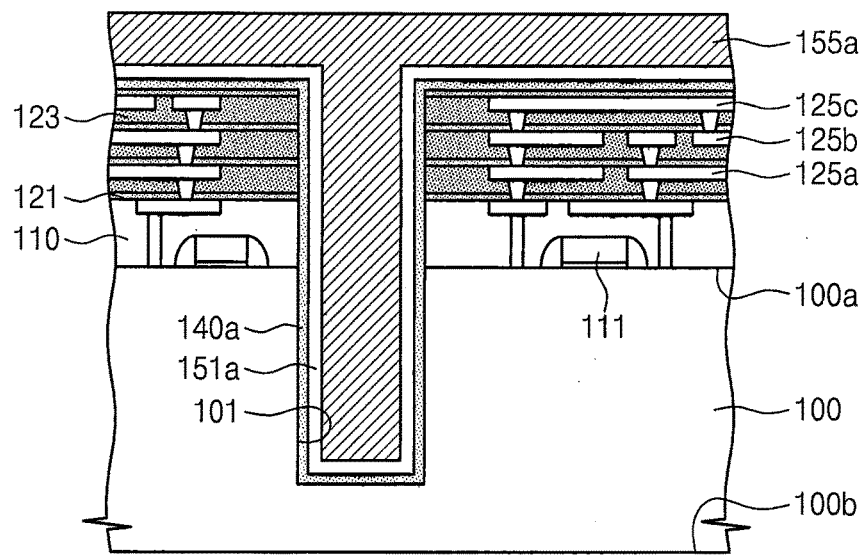

Referring to FIG. 7C, the insulation layer 14Qa may be formed to cover the inner surface of the via-hole 101. The conductive layer 155a may be formed on the semiconductor substrate 100 to fill the via-hole 101. When the conductive layer 155a is formed of a conductive material such as copper or alloy thereof, the metal layer 151*a* capable of prevent copper from being diffused may be further formed on the insulation layer 140*a*.

Figure 7D:
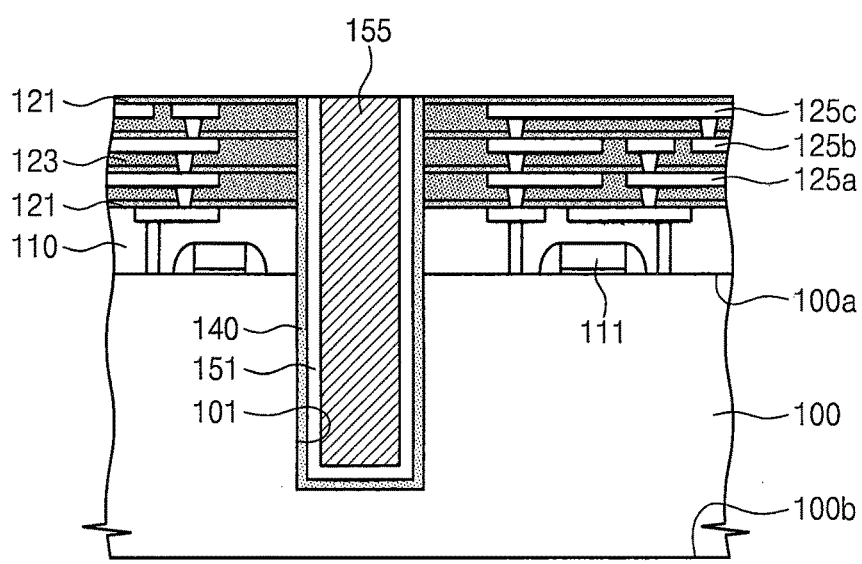

Referring to FIG. 7D, after forming the conductive layer 155*a*, a planarization process may be performed to the conductive layer 155*a*, the metal layer 151*a*, and the insulation layer 140*a*. The planarization process may be performed until an uppermost capping layer 121 is exposed. The planarization process may change the insulation layer 140*a*, the metal layer 151*a*, and the conductive layer 155*a* into the via-insulation layer 140, the barrier layer 151, and the through electrode 155, respectively.

Figure 7E:
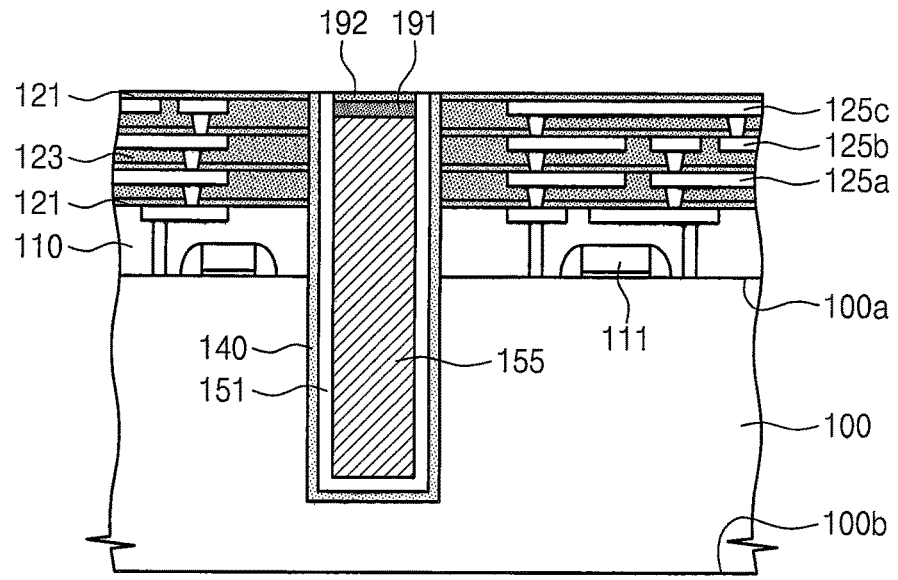

Referring to FIG. 7E, the top portion of the through electrode 155 may be exposed by the planarization process. When subsequent processes are performed under the top portion of the through electrode 155 is exposed, a metallic constituent of the through electrode 155 may diffuse and/or a native oxide layer such as CuO may be formed on the exposed top portion of the through electrode 155. In some embodiments, the process described in the FIG. 2B or 2C may change the top portion of the through electrode 155 into the first protection layer 191. Before the formation of the first protection layer 191, the cleaning process of FIG. 2A may be further performed. Selectively, the process described in FIG. 2D or 2E may be performed to form the second protection layer 192 that covers the first protection layer 191. The first protection layer 191 and the second protection layer 192 may be self-aligned with the through electrode 155.

Figure 7F:
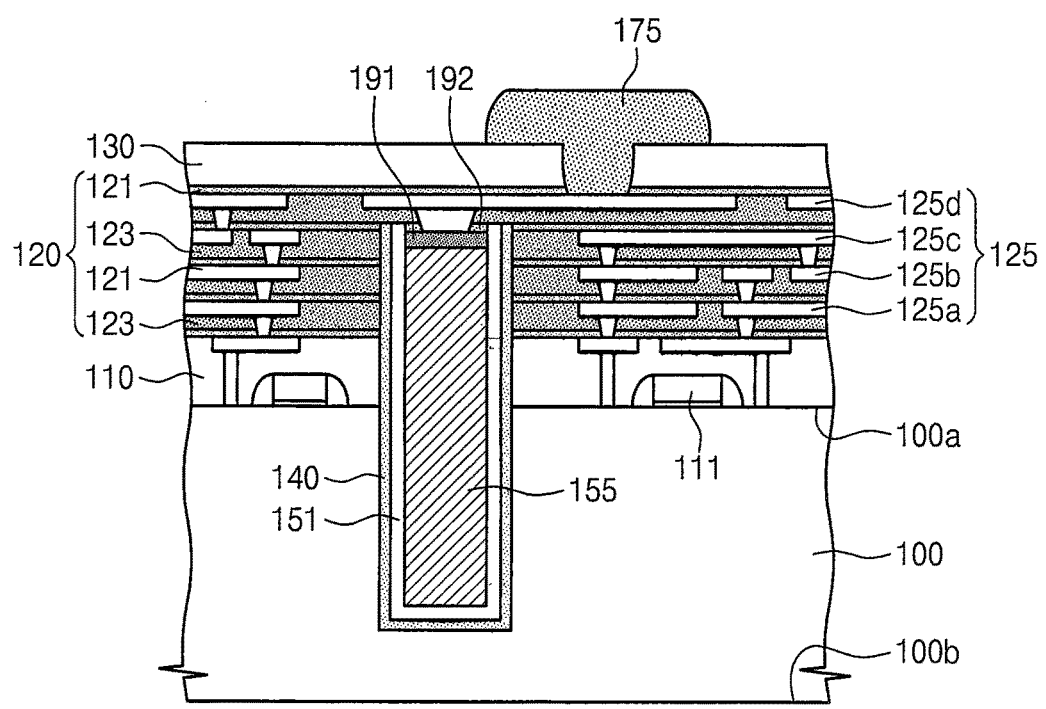

Referring to FIG. 7F, additional low-k dielectric layer 123 may be formed on the semiconductor substrate 100 to cover the through electrode 155, and then the fourth metal line 125*d* may be formed to be electrically connected to the through electrode 155 by a damascene process (e.g., a double damascene process). The fourth metal line 125*d* may penetrate the second protection layer 192 to be connected to the first protection layer 191. Alternatively, identically or similarly to FIG. 1K, the fourth metal line 125*d* may penetrate the second protection layer 192 and further penetrate the first protection layer 191 to be connected to the through electrode 155. Additional capping layer 121 covering the fourth metal line 125*d* may be formed and then the upper insulation layer 130 may be formed on the additional capping layer 121.

The first to fourth metal lines 125*a*, 125*b*, 125*c* and 125*d* may constitute the multi-layered metal line 125, and the low-k dielectric layers 123 and the capping layers 121 may constitute the intermetal dielectric layer 120.

The upper terminal 175 may be formed on the upper insulation layer 130. The upper terminal 175 may penetrate the upper insulation layer 130 and the capping layer 121 thereunder to be electrically connected to the fourth metal line 125*d*.

Figure 7G:
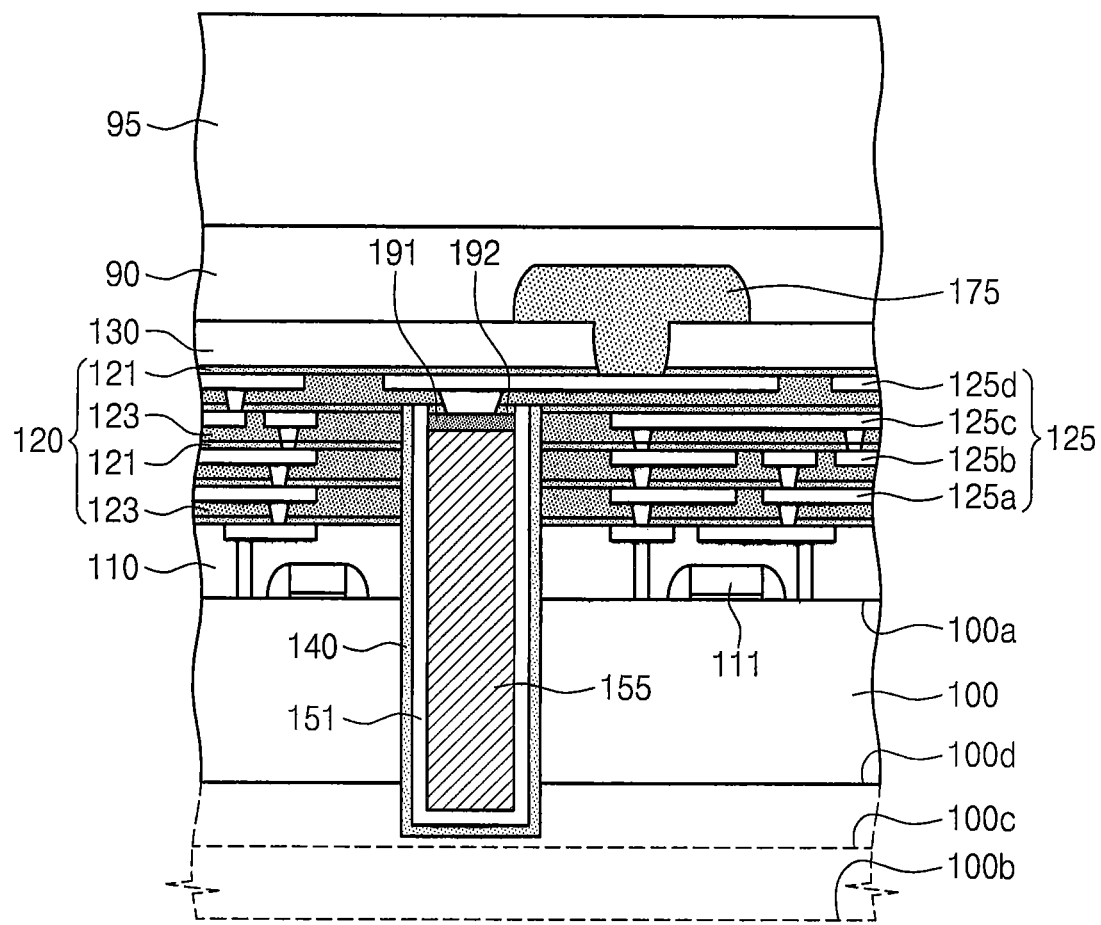

Referring to FIG. 7G, the bottom surface 100*b* of the semiconductor substrate 100 may be recessed until the through electrode 155 protrudes under a condition that the carrier 95 is adhered to the top surface 100*a* of the semiconductor substrate 100 by the adhesive layer 90. For example, the bottom surface 100*b* of the semiconductor substrate 100 may be chemically mechanically polished or grinded to reveal the second bottom surface 100*c* through which the through electrode 155 is not exposed, and the second bottom surface 100*c* may be then dry-etched or chemically mechanically polished to reveal the inactive surface 100*d* from which the through electrode 155 protruded.

Figure 7H:
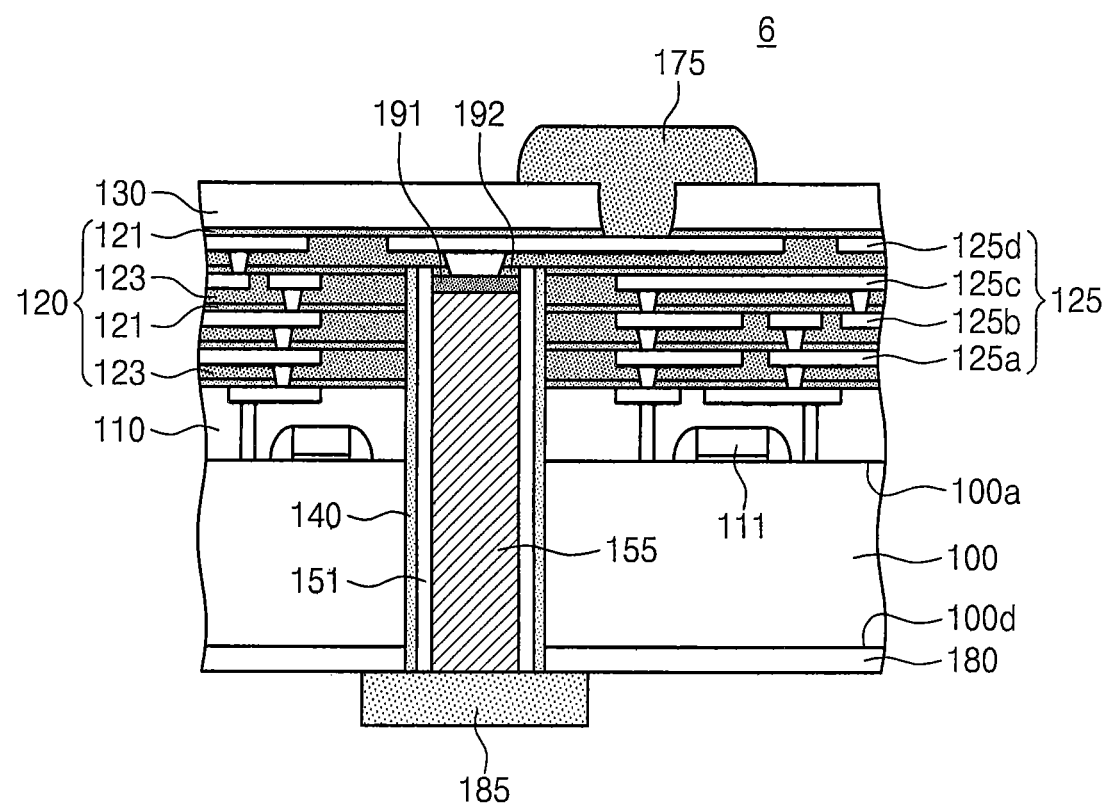

Referring to FIG. 7H, a silicon oxide layer or a silicon nitride layer may be deposited on the inactive surface 100*d*, and the silicon oxide layer or the silicon nitride layer may be then chemically mechanically polished to form the planarized low insulation layer 180. The lower terminal 185 having a pad-shape or a solder ball-shape may be formed on the lower insulation layer 180 to be electrically connected to the through electrode 155. The series of the processes described above may fabricate a semiconductor device 6 including the through electrode 155 that is covered by the self-aligned first protection layer 191 and the optional second protection layer 192.

Figure 8:
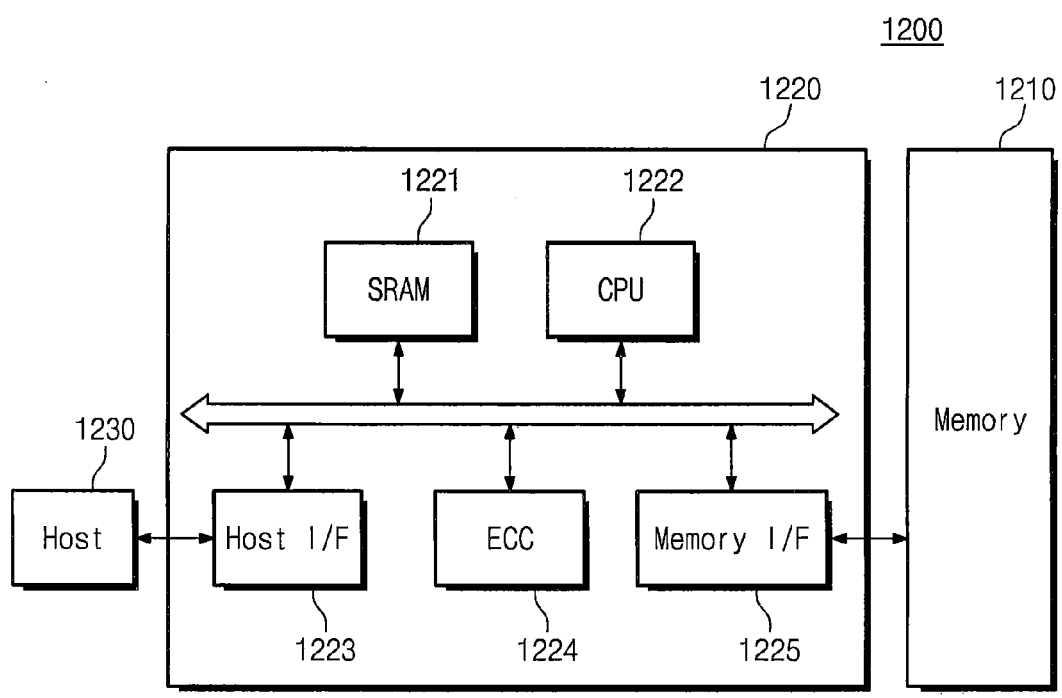
FIG. 8 is a schematic block diagram illustrating an example of memory cards including a semiconductor device according to exemplary embodiments of the present inventive concepts.
Figure 9:
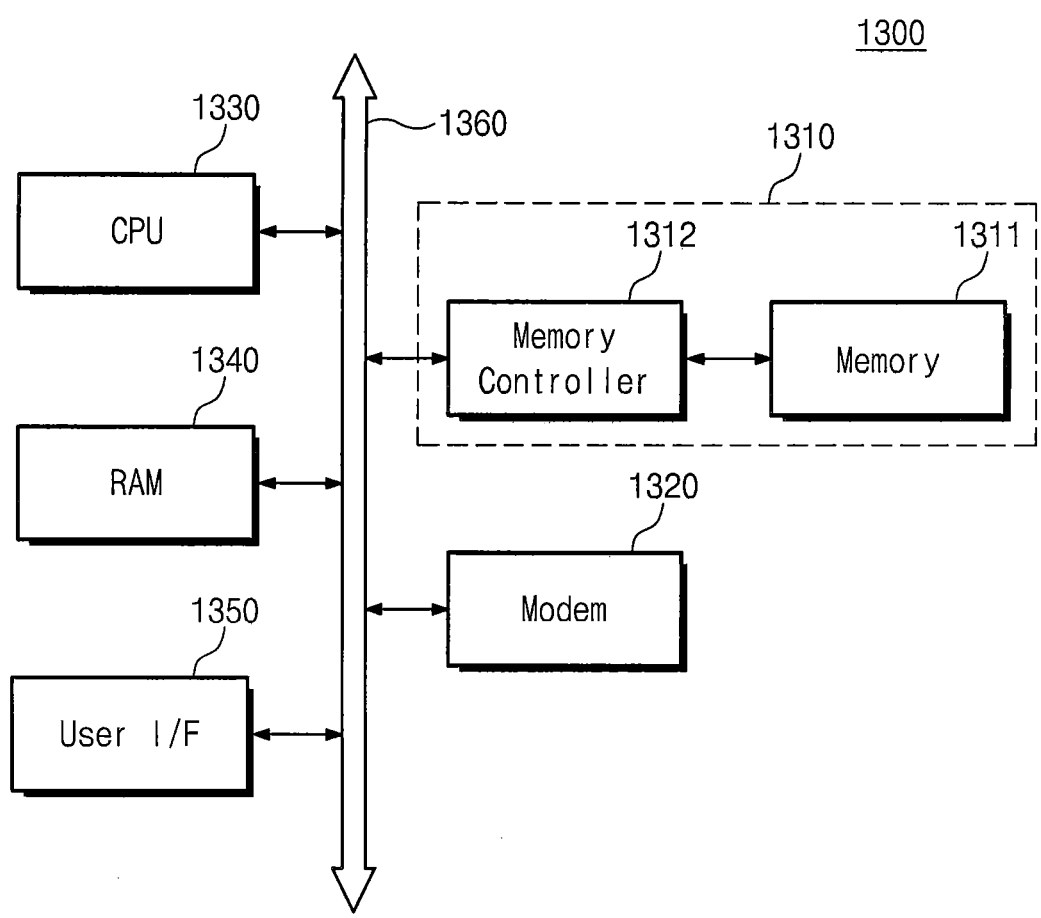
FIG. 9 is a schematic block diagram illustrating an example of information process system including a semiconductor device according to exemplary embodiments of the present inventive concepts.

FIG. 8 is a schematic block diagram illustrating an example of memory cards including a semiconductor device according to exemplary embodiments of the present inventive concepts. FIG. 9 is a schematic block diagram illustrating an example of information process system including a semiconductor device according to exemplary embodiments of the present inventive concepts.

Referring to FIG. 8, a memory 1210 including at least one of the semiconductor devices 1 to 6 according to exemplary embodiments of the inventive concepts is applicable to a memory card 1200. For example, the memory card 1200 may include a memory controller 1220 generally controlling data exchange between a host 1230 and the memory 1210. An SRAM 1221 may be used as a work memory of a central processing unit 1222. A host interface 1223 may have a data exchange protocol of the host 1230 connected to the memory card 1200. An error correction coding block 1224 may detect and correct errors of data that are read from the memory 1210. A memory interface 1225 may interface the memory 1210. The central processing unit 1222 may generally control data exchange of the memory controller 1220. The central processing unit 1222 may include at least one of the semiconductor devices 1 to 6 according to exemplary embodiments of the inventive concepts.

Referring to FIG. 9, an information processing system 1300 may include a memory system 1310 having at least one of the semiconductor devices 1 to 6 according exemplary embodiments of the inventive concepts. The information processing system 1300 may include a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312 and have substantially the same configuration as that of the memory card 1200 in FIG. 8. At least one of the central processing unit 1330 and the RAM 1340 may include the at least one of the semiconductor devices 1 to 6 according exemplary embodiments of the inventive concepts.

The memory system 1310 may store data processed by the central processing unit 1330 or data input from the outside. The information process system 1300 may be provided as a memory card, a solid state disk, a semiconductor device disk, a camera image sensor, and other application chipsets. In some embodiments, the memory system 1310 may be used as a portion of a solid state drive (SSD), and in this case, the information processing system 1300 may stably and reliably store a large amount of data in the memory system 1310.

According to embodiments of the present invention, the top surface of the through electrode is capped with the self-aligned protection layer so that a metallic constituent of the through electrode can be prevented from being diffused, thereby eliminating electrical defectiveness of the semiconductor device. Therefore, electrical characteristics of the semiconductor device can be improved.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
    a semiconductor substrate including an integrated circuit therein;
    an interlayer dielectric layer on the semiconductor substrate to cover the integrated circuit;
    an intermetal dielectric layer on the interlayer dielectric layer;
    at least one metal line in the intermetal dielectric layer, the at least one metal line being electrically connected to the integrated circuit;
    a through electrode that vertically penetrates the interlayer dielectric layer and the semiconductor substrate, the through electrode being electrically connected to the at least one metal line and comprising a top end that faces the at least one metal line;
    a first protection layer covering the top end of the through electrode and including a conducting metal element that is also included in the through electrode; and
    a second protection layer on the first protection layer,
    wherein the at least one metal line comprises a first metal line that is on the interlayer dielectric layer and is electrically connected to the through electrode,
    wherein the intermetal dielectric layer comprises a first insulation layer that is on the interlayer dielectric layer and the second protection layer, and
    wherein the first metal line is in the first insulation layer and penetrates the second protection layer.

2. The semiconductor device of claim 1, wherein the at least one metal line further comprises
    a second metal line that is provided on the first metal line and is connected to the first metal line,
    wherein the first protection layer is provided on the top end of the through electrode and is not provided on the interlayer dielectric layer.

3. The semiconductor device of claim 2, wherein the first protection layer comprises a top surface whose level is substantially same as or higher than a top surface of the interlayer dielectric layer.

4. The semiconductor device of claim 1, wherein the first metal line further penetrates the first protection layer to be connected to the top end of the through electrode.

5. The semiconductor device of claim 1, wherein the at least one metal line further comprises
    a second metal line that is provided on the first metal line and is connected to the first metal line,
    wherein the second protection layer is provided on the first protection layer and is not provided on the interlayer dielectric layer.

6. The semiconductor device of claim 5,
    wherein the second protection layer includes a top surface whose level is substantially same as or higher than a top surface of the interlayer dielectric layer, and
    wherein the first protection layer includes a top surface whose level is lower than the top surface of the interlayer dielectric layer.

7. The semiconductor device of claim 1,
    wherein the through electrode includes copper,
    wherein the first protection layer includes a combination of copper and silicon, and
    wherein the second protection layer includes the combination of copper and silicon and further includes nitrogen.

8. The semiconductor device of claim 1, wherein the second protection layer comprises an insulating material including the conducting metal element.

9. The semiconductor device of claim 1,
    wherein the at least one metal line further comprises
        a second metal line that is provided on the first metal line and is connected thereto,
    wherein the intermetal dielectric layer further comprises:
        a second insulation layer that is provided on the first insulation layer and includes the second metal line therein; and
        a capping layer that is provided between the first insulation layer and the second insulation layer and covers the first metal line,
    wherein the capping layer is not provided on the interlayer dielectric layer.

10. The semiconductor device of claim 1, wherein the first metal line comprises a lower portion that penetrates the second protection layer, and
    wherein a bottom surface of the lower portion of the first metal line is lower than a top surface of the interlayer dielectric layer.

11. A semiconductor device comprising:
    a substrate including a dielectric layer disposed on a top surface thereof, the dielectric layer including an integrated circuit and metal lines therein;
    a through electrode that vertically penetrates the substrate to be electrically connected to the integrated circuit via at least one of the metal lines, the through electrode including an upper portion protruding from the top surface of the substrate;
    a first protection layer on the upper portion of the through electrode; and
    a second protection layer on the first protection layer,
    wherein the at least one of the metal lines comprises a plurality of first metal lines that are on the through electrode and horizontally spaced apart from each other,
    wherein the dielectric layer comprises an insulation layer that is on the second protection layer and includes the plurality of first metal lines therein, and
    wherein top surfaces of the plurality of first metal lines are substantially coplanar with a top surface of the insulation layer.

12. The semiconductor device of claim 11,
    wherein the plurality of first metal lines respectively include protruding portions extending downwardly toward the through electrode to contact the first protection layer, and the second protection layer occupies a space between adjacent protruding portions of the plurality of first metal lines.

13. The semiconductor device of claim 12, wherein the plurality of first metal hues are vertically spaced apart from the upper portion of the through electrode,
    wherein the semiconductor device further comprises a plurality of vias between respective ones of the plurality of first metal lines and the first protection layer, and
    wherein the plurality of vias penetrate the second protection layer to contact the first protection layer.

14. The semiconductor device of claim 11, wherein the plurality of first metal lines respectively include protruding portions extending downwardly toward the through electrode to penetrate the second protection layer and the first protection layer to contact a top end of the through electrode.

15. The semiconductor device of claim 11, wherein the upper portion of the through electrode has a width gradually greater away from the top surface of the substrate.

16. A semiconductor device comprising:
a substrate including a dielectric layer disposed on a top surface thereof, the dielectric layer including an integrated circuit and metal lines therein;
a through electrode that vertically penetrates the substrate to be electrically connected to the integrated circuit via at least one of the metal lines, the through electrode including an upper portion protruding from the top surface of the substrate;
a first protection layer on the upper portion of the through electrode, the first protection layer including a conducting metal element that is included in the through electrode; and
a second protection layer on the first protection layer,
wherein the at least one of the metal lines comprises a first metal line that is on the through electrode,
wherein the dielectric layer comprises an insulation layer that is on the second protection layer and includes the first metal line therein, and
wherein the first metal line penetrates the second protection layer.

17. The device of claim 16 wherein the first protection layer is self-aligned with the through electrode.

18. The device of claim 16, wherein an entirety of the first protection layer overlaps the upper portion of the through electrode in a plan view.

* * * * *